United States Patent
Jeon et al.

(10) Patent No.: US 11,437,449 B2
(45) Date of Patent: Sep. 6, 2022

(54) DISPLAY PANEL AND DISPLAY DEVICE INCLUDING THE SAME

(71) Applicant: Samsung Display Co., Ltd., Yongin-si (KR)

(72) Inventors: Joohee Jeon, Yongin-si (KR); Yoomin Ko, Yongin-si (KR); Sanghoon Kim, Yongin-si (KR); Seungchan Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 268 days.

(21) Appl. No.: 16/895,122

(22) Filed: Jun. 8, 2020

(65) Prior Publication Data

US 2021/0005687 A1   Jan. 7, 2021

(30) Foreign Application Priority Data

Jul. 1, 2019   (KR) .................. 10-2019-0079002

(51) Int. Cl.
*H01L 27/32* (2006.01)
*H01L 51/52* (2006.01)

(52) U.S. Cl.
CPC ...... *H01L 27/3246* (2013.01); *H01L 27/3211* (2013.01); *H01L 27/326* (2013.01); *H01L 27/3248* (2013.01); *H01L 27/3276* (2013.01); *H01L 51/5253* (2013.01)

(58) Field of Classification Search
CPC .................. H01L 27/3246; H01L 27/3211
USPC .......................................................... 257/40
See application file for complete search history.

(56) References Cited

U.S. PATENT DOCUMENTS

| | | | |
|---|---|---|---|
| 9,496,524 B2 | 11/2016 | Lee et al. | |
| 9,911,941 B2 | 3/2018 | Choi et al. | |
| 10,090,484 B1 | 10/2018 | Kwon et al. | |
| 2003/0189400 A1* | 10/2003 | Nishio | H01L 51/001 313/504 |
| 2007/0205420 A1* | 9/2007 | Ponjee | H01L 27/3269 257/E27.12 |

(Continued)

FOREIGN PATENT DOCUMENTS

| | | |
|---|---|---|
| KR | 10-2014-0044110 A | 4/2014 |
| KR | 10-2016-0130042 A | 11/2016 |

(Continued)

*Primary Examiner* — Xia L Cross
(74) *Attorney, Agent, or Firm* — Lewis Roca Rothgerber Christie LLP

(57) ABSTRACT

A display panel includes: a substrate comprising a main display area and an auxiliary display area comprising a first pixel area, a second pixel area, and a transmission area; a first pixel in the first pixel area and comprising a first pixel electrode, a first opposite electrode, and a first intermediate layer between the first pixel electrode and the first opposite electrode; a second pixel in the second pixel area and comprising a second pixel electrode, a second opposite electrode, and a second intermediate layer between the second pixel electrode and the second opposite electrode; a pixel-defining layer on the first pixel electrode and the second pixel electrode and having a first opening and a second opening through which centers of the first pixel electrode and the second pixel electrode are respectively exposed; and a first barrier wall on the pixel-defining layer.

20 Claims, 18 Drawing Sheets

(56) References Cited

U.S. PATENT DOCUMENTS

| | | | |
|---|---|---|---|
| 2012/0267611 A1* | 10/2012 | Chung | H01L 51/5281 |
| | | | 257/E27.118 |
| 2017/0256747 A1 | 9/2017 | Lee et al. | |
| 2018/0108685 A1* | 4/2018 | Kim | H01L 27/1262 |
| 2018/0122863 A1* | 5/2018 | Bok | H01L 51/5012 |
| 2018/0261783 A1 | 9/2018 | Yun et al. | |

FOREIGN PATENT DOCUMENTS

| | | |
|---|---|---|
| KR | 10-2017-0104097 A | 9/2017 |
| KR | 10-2018-0104209 A | 9/2018 |
| KR | 10-2018-0104227 A | 9/2018 |

* cited by examiner

DISPLAY PANEL AND DISPLAY DEVICE INCLUDING THE SAME

CROSS-REFERENCE TO RELATED APPLICATION

This application claims priority to and the benefit of Korean Patent Application No. 10-2019-0079002, filed on Jul. 1, 2019, in the Korean Intellectual Property Office, the disclosure of which is incorporated herein in its entirety by reference.

BACKGROUND

1. Field

Aspects of some example embodiments relate to a display panel and a display device including the same.

2. Description of Related Art

Recently, the various uses or applications of display devices have become diverse. Also, as the thicknesses and weights of the display devices have decreased, the range of the uses thereof has increased.

As the display devices are utilized in various ways, there may be various methods of designing the shapes of the display devices. Also, functions of combining/connecting a display device with/to another display device have increased.

The above information disclosed in this Background section is only for enhancement of understanding of the background and therefore the information discussed in this Background section does not necessarily constitute prior art.

SUMMARY

Aspects of some example embodiments relate to a display panel and a display device including the same, and for example, to a display panel having improved quality and a display device including the same.

One or more example embodiments include a display device having an auxiliary display area in which a sensor, etc. may be placed inside a display area so that functions of combining/connecting a display device with/to another display device may be increased. However, this characteristic is just an example, and the scope of embodiments according to the present disclosure is not limited thereby.

Additional aspects will be set forth in part in the description which follows and, in part, will be more apparent from the description, or may be learned by practice of the presented example embodiments of the disclosure.

According to one or more example embodiments, a display panel includes a substrate including a main display area and an auxiliary display area including a first pixel area, a second pixel area, and a transmission area, a first pixel in the first pixel area and including a first pixel electrode, a first opposite electrode, and a first intermediate layer between the first pixel electrode and the first opposite electrode, a second pixel in the second pixel area and including a second pixel electrode, a second opposite electrode, and a second intermediate layer between the second pixel electrode and the second opposite electrode, a pixel-defining layer on the first pixel electrode and the second pixel electrode and having a first opening and a second opening through which centers of the first pixel electrode and the second pixel electrode are exposed, and a first barrier wall on the pixel-defining layer between the first pixel and the second pixel and having a top surface on which the first opposite electrode and the second opposite electrode overlap each other.

According to some example embodiments, the display panel may further include a third pixel in the first pixel area, wherein the third pixel includes a third pixel electrode, a third intermediate layer on the third pixel electrode, and the first opposite electrode in the first pixel area corresponding to the third intermediate layer.

According to some example embodiments, the display panel may further include a second barrier wall on the pixel-defining layer between the first pixel and the third pixel.

According to some example embodiments, the first opposite electrode may be on a top surface of the second barrier wall.

According to some example embodiments, the display panel may further include a fourth pixel in the second pixel area, wherein the fourth pixel includes a fourth pixel electrode, a fourth intermediate layer on the fourth pixel electrode, and the second opposite electrode in the second pixel area corresponding to the fourth intermediate layer.

According to some example embodiments, the display panel may further include a third barrier wall on the pixel-defining layer between the second pixel and the fourth pixel.

According to some example embodiments, the second opposite electrode may be on a top surface of the third barrier wall.

According to some example embodiments, a distal end of the first opposite electrode and a distal end of the second opposite electrode that overlap each other on the first barrier wall may be on the first barrier wall.

According to some example embodiments, the first opposite electrode and the second opposite electrode may have an overlapping area in which at least a part of the first opposite electrode and at least a part of the second opposite electrode overlap each other, and the overlapping area may have a first reflectivity, and the first pixel area and the second pixel area other than the overlapping area may have a second reflectivity that is different from the first reflectivity.

According to some example embodiments, the first opposite electrode may be in at least one first pixel area.

According to some example embodiments, the second opposite electrode may be in at least one second pixel area.

According to some example embodiments, a top surface of the first opposite electrode and a bottom surface of the second opposite electrode may be in surface contact with each other on the first barrier wall and may be in electric contact with each other.

According to some example embodiments, the first pixel area, the second pixel area, and the transmission area may cross one another and may be in a grid arrangement.

According to some example embodiments, the first opposite electrode may have a shape of a first rectangle with a first width in a first direction, and the second opposite electrode may have a shape of a second rectangle with a second width in the first direction, and a size of the first width may be the same as that of the second width.

According to some example embodiments, a plurality of first pixel areas, a plurality of second pixel areas, and a plurality of transmission areas may be in the auxiliary display area, and the plurality of first pixel areas and the plurality of second pixel areas may be in a third direction, and the plurality of transmission areas may be in the third direction.

According to one or more example embodiments, a display device includes: a display panel including a substrate including a main display area and an auxiliary display area including a pixel area and a transmission area, the pixel area including a first pixel area and a second pixel area, a first pixel in the first pixel area and including a first pixel electrode, a first opposite electrode, and a first intermediate layer between the first pixel electrode and the first opposite electrode, a second pixel in the second pixel area and including a second pixel electrode, a second opposite electrode, and a second intermediate layer between the second pixel electrode and the second opposite electrode, a pixel-defining layer, which is on the first pixel electrode and the second pixel electrode and through which centers of the first pixel electrode and the second pixel electrode are exposed, and a first barrier wall on the pixel-defining layer between the first pixel and the second pixel and having a top surface on which the first opposite electrode and the second opposite electrode overlap each other; and a component under the substrate at or corresponding to the auxiliary display area and including an electronic element configured to emit or receive a signal (e.g., light or sound).

According to some example embodiments, resolution of an image provided from the auxiliary display area may be lower than resolution of an image provided from the main display area.

According to some example embodiments, the first opposite electrode and the second opposite electrode may have an overlapping area in which at least a part of the first opposite electrode and at least a part of the second opposite electrode overlap each other, and the overlapping area may have a first reflectivity, and the first pixel area and the second pixel area other than the overlapping area may have a second reflectivity that is different from the first reflectivity.

According to some example embodiments, a top surface of the first opposite electrode and a bottom surface of the second opposite electrode may be in surface contact with each other on the first barrier wall and may be in electric contact with each other.

According to some example embodiments, the first pixel area, the second pixel area, and the transmission area may cross one another and may be in a grid arrangement.

BRIEF DESCRIPTION OF THE DRAWINGS

The above and other aspects, features, and characteristics of certain example embodiments of the disclosure will be more apparent from the following description taken in conjunction with the accompanying drawings, in which.

DETAILED DESCRIPTION

Figure 1:
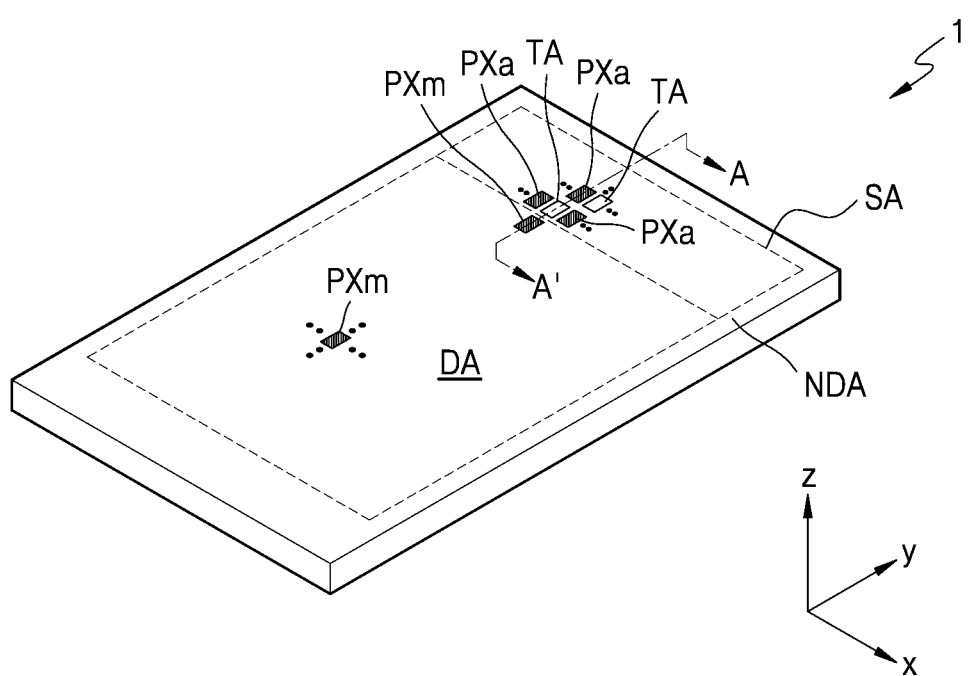
FIG. 1 is a perspective view schematically illustrating a display device according to some example embodiments.

Reference will now be made in more detail to example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

As the present disclosure allows for various changes and numerous embodiments, particular embodiments will be illustrated in the drawings and described in more detail in the written description. The characteristics and features of some example embodiments of the present disclosure, and ways to achieve them will become more apparent by referring to example embodiments that will be described later in more detail with reference to the drawings. However, embodiments according to the present disclosure are not limited to the following example embodiments but may be embodied in various forms.

Hereinafter, example embodiments of the present disclosure will be described below in more detail with reference to the accompanying drawings. Those components that are the same or are in correspondence are rendered the same reference numeral regardless of the figure number, and a redundant description therewith is omitted.

It will be understood that although the terms "first", "second", etc. may be used herein to describe various components, these components should not be limited by these terms. These components are only used to distinguish one component from another. As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it may be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a perspective view schematically illustrating a display device 1 according to some example embodiments.

Referring to FIG. 1, the display device 1 includes a display area (DA and SA) at which an image is realized and a non-display area NDA at which no image is realized. That is, the display device 1 is configures to display images at the display area (DA and SA), and images are not displayed at the non-display area NDA. The display area includes a main display area DA and an auxiliary display area SA inside the main display area DA. The display device 1 may provide a main image using light emitted from a plurality of main pixels PXm in the main display area DA.

The display device 1 further includes the auxiliary display area SA inside the main display area DA. The auxiliary display area SA may be an area, which is under the display area DA and in which a component, such as a sensor using infrared rays (IRs), visible rays, or sound is positioned, as will be described in more detail later with reference to FIG. 2. The auxiliary display area SA may include a transmission area TA through which light or/and sound output from the component or proceeding towards the component from outside may transmit. According to some example embodiments, when IRs are transmitted through the auxiliary display area SA, light transmittance may be about 10% or higher, more particularly, about 20% or higher, about 25% or higher, about 50% or higher, 85% or higher, or 90% or higher.

According to some example embodiments, a plurality of auxiliary pixels PXa may be positioned in the auxiliary display area SA, and a certain image may be provided from the auxiliary display area SA using pieces of light emitted from the plurality of auxiliary pixels PXa. The image provided from the auxiliary display area SA may be an auxiliary image and may have lower resolution than that of an image provided from the main display area DA. That is, because the auxiliary display area SA includes the transmission area TA through which light or/and sound may transmit, the number of auxiliary pixels PXa that may be positioned per unit area may be less than the number of main pixels PXm positioned per unit area in the main display area DA.

According to some example embodiments, the auxiliary display area SA may be at one side of the main display area DA. According to some example embodiments, FIG. 1 illustrates that the auxiliary display area SA is at an upper side of the main display area DA and is between the non-display area NDA and the main display area DA.

Hereinafter, the display device 1 is described as utilizing an organic light-emitting display diode (OLED) display device according to some example embodiments. However, a display device according to embodiments of the present disclosure is not limited thereto. According to some example embodiments, a variety of types of display devices, such as an inorganic electroluminescence (EL) light-emitting display device, a quantum dot light-emitting display device, etc., may be used.

In FIG. 1, the auxiliary display area SA is at the upper side of the main display area DA having a rectangular shape. However, embodiments are not limited thereto. The shape of the main display area DA may be a circular shape, an oval shape, or a polygonal shape, such as a triangular shape or a pentagonal shape, and the position and the number of auxiliary display areas SA may be modified in various ways.

Thus, as illustrated in FIG. 1, embodiments according to the present invention include a display device 1, having a display area (DA and SA) and a non-display area NDA around the display area. The display area may include a main display area DA having a plurality of main pixels PXm and one or more auxiliary display areas SA, having a plurality of auxiliary pixels PXa located within the main display area DA. One or more components, such as sensors or sound or light emitters (e.g., speakers) (described in more detail below) may additionally be located at the auxiliary display areas SA. The density of auxiliary pixels PXa at the auxiliary display areas SA may be less than the density of the main pixels PXm at the main display area DA, in order to accommodate for one or more transmission areas TA, to allow light or sound (emitted or received by the one or more components) to pass through the transmission areas TA.

Figure 2:
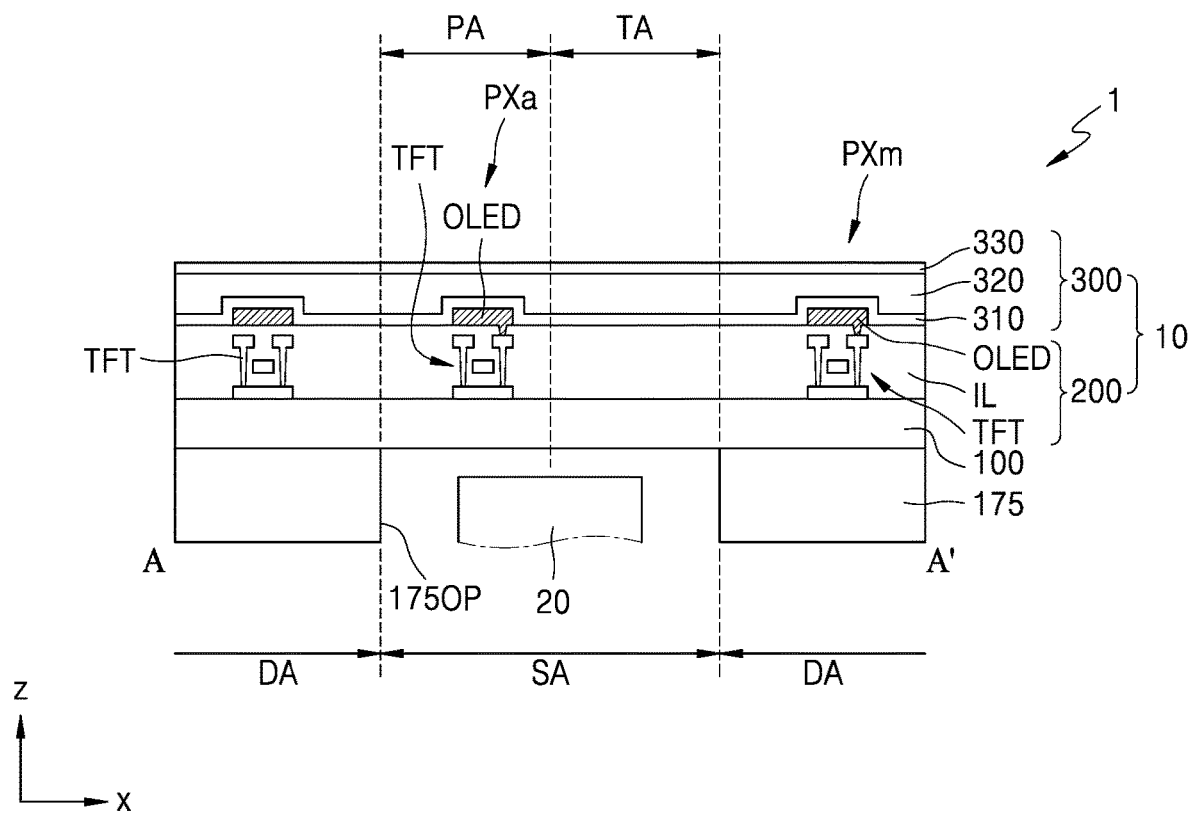
FIG. 2 is a cross-sectional view schematically illustrating a display device according to some example embodiments.

FIG. 2 is a cross-sectional view schematically illustrating a display device 1 according to some example embodiments. FIG. 2 may correspond to a cross-section taken along a line A-A' of FIG. 1.

Referring to FIG. 2, the display device 1 may include a display panel 10 including a display element, and a component 20, which is positioned under the display panel 10 and corresponds to the auxiliary display area SA. In FIG. 2, the component 20 corresponds to one pixel area PA and one transmission area TA. However, embodiments are not limited thereto, and the component 20 may correspond to a plurality of pixel areas PA and a plurality of transmission areas TA.

The display panel 10 may include a substrate 100, a display element layer 200 positioned on the substrate 100, and a thin-film encapsulation layer 300 that is a sealing member sealing the display element layer 200. Also, the display panel 10 may further include a lower protective film 175 under the substrate 100.

The substrate 100 may include glass or polymer resin. The polymer resin may include polyethersulfone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), or cellulose acetate propionate (CAP). The substrate 100 including the polymer resin may be flexible, rollable, or bendable. The substrate 100 may have a multi-layer structure including a layer including the above-described polymer resin and an inorganic layer.

The display element layer 200 may include a circuit layer including a thin-film transistor TFT, an organic light-emitting diode OLED as a display element, and an insulating layer IL therebetween.

The main pixels PXm including a thin-film transistor TFT and an organic light-emitting diode OLED connected thereto may be positioned in the main display area DA, the auxiliary pixels PXa including a thin-film transistor TFT and an organic light-emitting diode OLED connected thereto, and wires may be positioned in the auxiliary display area SA.

Also, the thin-film transistor TFT and the transmission area TA at which no display element is placed may be positioned in the auxiliary display area SA. The transmission area TA may be an area through which light or signals emitted from the component 20 or light or signals incident on the component 20 may pass or be transmitted.

The component 20 may be placed in the auxiliary display area SA. The component 20 may include an electronic element that uses light or sound. For example, the component 20 may include a sensor that receives and uses light, such as an IR sensor, a sensor that outputs and detects light or sound so as to measure a distance or recognize a fingerprint, a small lamp that outputs light, a speaker that outputs sound, or a camera sensor. Embodiments of the present disclosure are not limited to the components listed above, however, and may include any other suitable component, for example, components configured to transmit or receive signals (e.g., light, radio wave, IR, sound, etc.). In the case of an electronic element that uses light, pieces of light having various wavelengths, such as visible rays, IR rays, and ultraviolet (UV) rays, may be used. There may be a plurality of components 20 positioned in the auxiliary display area SA. For example, a light-emitting device and a light-receiving device as the component 20 may be provided in one auxiliary display area SA. Alternatively, a light-emitting portion and a light-receiving portion may be simultaneously provided in one component 20.

A thin-film encapsulation layer 300 may include at least one inorganic encapsulation layer and at least one organic encapsulation layer. In this regard, FIG. 2 illustrates first and second inorganic encapsulation layers 310 and 330 and an organic encapsulation layer 320 therebetween.

The first and second inorganic encapsulation layers 310 and 330 may include one or more inorganic insulating materials, such as aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include PET, PEN, PC, PI, polyethersulfonate, polyoxymethylene, polyacrylate, hexamethyldisiloxane (HMDSO), acryl-based resin (for example, polymethyl methacrylate, polyacryl acid, etc.), or an arbitrary combination thereof.

The lower protective film 175 may be attached to the lower portion of the substrate 100 and may support and protect the substrate 100. The lower protective film 175 may include an opening 175OP that corresponds to the auxiliary display area SA. The opening 175OP may be formed in the lower protective film 175, and thus, light transmittance of the auxiliary display area SA may be improved. The lower protective film 175 may include PET or PI.

The area of the auxiliary display area SA may be greater than the area in which the component 20 is positioned. In FIG. 2, the area of the auxiliary display area SA is the same as that of the opening 175OP of the lower protective film 175. However, the area of the opening 175OP formed in the lower protective film 175 may not be the same as the area of the auxiliary display area SA. For example, the area of the opening 175OP may be less than the area of the auxiliary display area SA.

Also, a plurality of components 20 may be positioned in the auxiliary display area SA. The plurality of components 20 may have different functions.

According to some example embodiments, elements, such as an input sensing member that senses a touch input, an antireflective member including a polarizer, a retarder, or a color filter and a black matrix, and a transparent window, may be further positioned on the display panel 10.

According to some example embodiments, the thin-film encapsulation layer 300 is used as an encapsulation member for sealing the display element layer 200. However, embodiments are not limited thereto. For example, a sealing substrate to be combined with the substrate 100 may also be used as a member for sealing the display element layer 200 using a sealant or frit.

Figure 3:
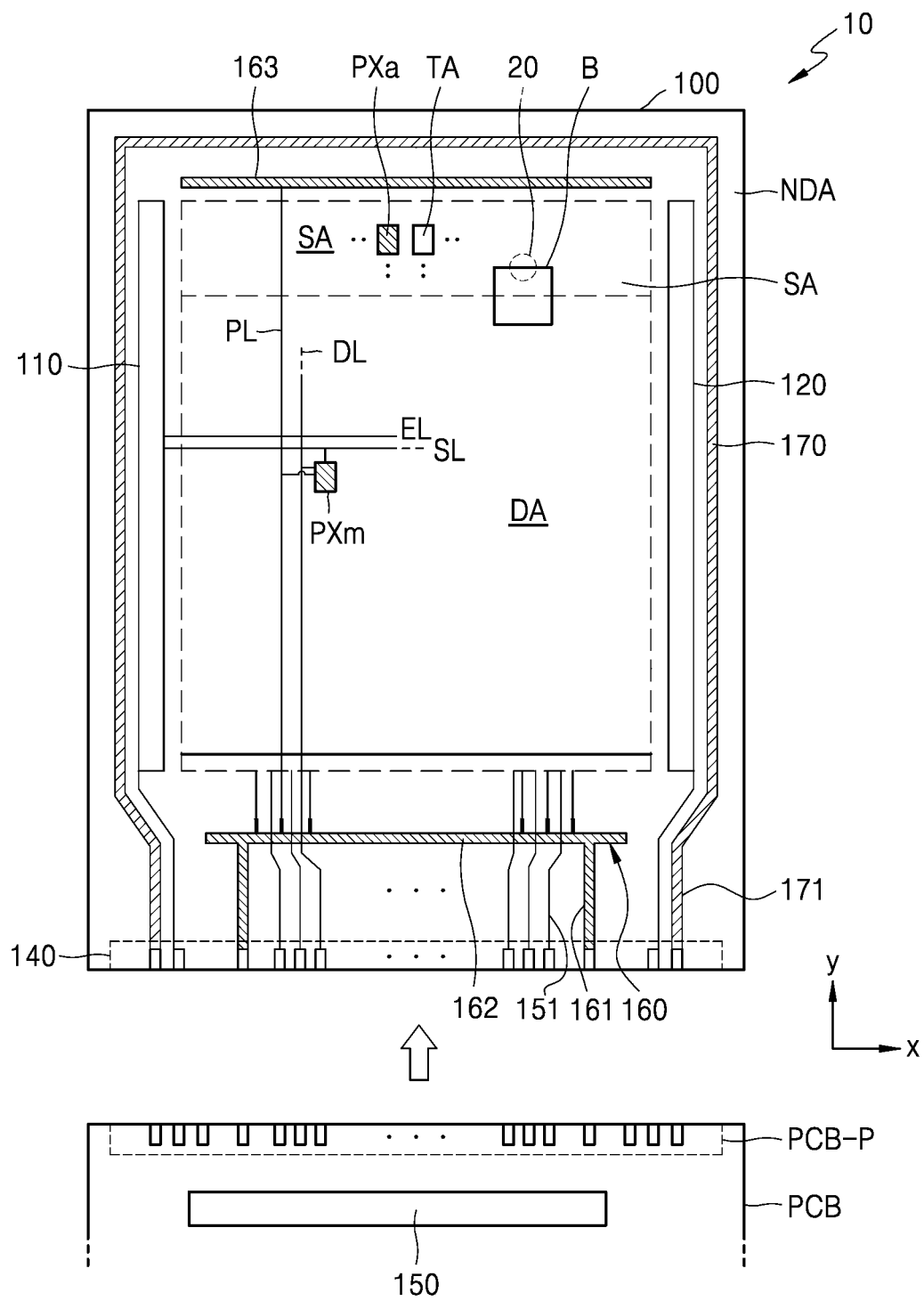
FIG. 3 is a plan view schematically illustrating a display panel according to some example embodiments.
Figure 4:
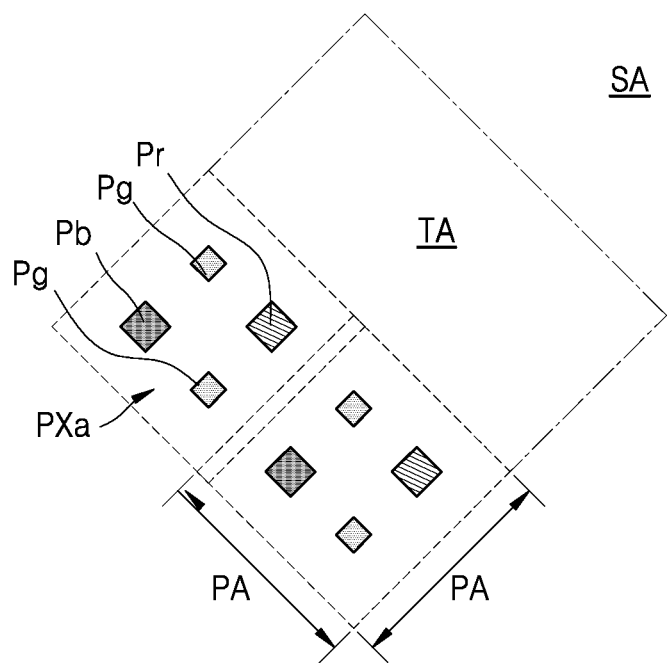
FIG. 4 is an expanded plan view illustrating an example of an auxiliary display area of FIG. 3.

FIG. 3 is a plan view schematically illustrating a display panel 10 according to some example embodiments, and FIG. 4 is an expanded plan view illustrating an example of the auxiliary display area SA of FIG. 3.

Referring to FIG. 3, various elements that constitute the display panel 10 are positioned on the substrate 100. The substrate 100 includes a display area and a non-display area NDA that surrounds the display area. The display area includes a main display area DA in which a main image is displayed and an auxiliary display area SA, which includes a transmission area TA therein and in which an auxiliary image is displayed.

Main pixels PXm are positioned in the main display area DA. Each of the main pixels PXm may include a display element, such as an organic light-emitting diode OLED. Each of the main pixels PXm may emit red light, green light, blue light, or white light from the organic light-emitting diode OLED. The main pixels PXm in the present specification may be pixels that emit one of red light, green light, blue light, and white light, as described above. The main display area DA may be covered by the encapsulation member described with reference to FIG. 2 and may be protected from external air or moisture.

The auxiliary display area SA may be at one side of the main display area DA, and auxiliary pixels PXa are positioned in the auxiliary display area SA. Each of the auxiliary pixels PXa may include a display element, such as an organic light-emitting diode OLED. Each of the auxiliary pixels PXa may emit red light, green light, blue light, or white light from the organic light-emitting diode OLED. The auxiliary pixels PXa in the present specification may be pixels that emit one of red light, green light, blue light, and white light, as described above. The transmission area TA may be provided in the auxiliary display area SA and between the auxiliary pixels PXa. At least one component 20 may be positioned to correspond to the lower portion of the auxiliary display area SA of the display panel 10.

Because the auxiliary display area SA includes the transmission area TA, the resolution of the auxiliary display area SA may be lower than that of the main display area DA. For example, the resolution of the auxiliary display area SA may be about ½ of that of the main display area DA. According to some example embodiments, the resolution of the main display area DA may be 400 ppi or higher, and the resolution of the auxiliary display area SA may be about 200 ppi.

Further details of the auxiliary display area SA according to some example embodiments will be described with reference to FIG. 4.

The auxiliary display area SA may include a pixel area PA including at least one auxiliary pixel PXa and the transmission area TA. The pixel area PA and the transmission area TA may be alternately provided in a fourth direction DR4 (see FIG. 8), for example, may in the form of grids.

The pixel area PA may include an auxiliary pixel Pr that emits red light, an auxiliary pixel Pg that emits green light, and an auxiliary pixel Pb that emits blue light. In FIG. 4, a Pentile-type auxiliary pixel PXa is shown. However, the auxiliary pixel PXa may be provided in the form of stripes or various forms. Also, in FIG. 4, four auxiliary pixels PXa are provided in one pixel area PA. However, the number of auxiliary pixels PXa may be modified according to the resolution of the auxiliary display area SA.

According to some example embodiments, a pixel circuit of one main pixel PXm may be the same as that of one auxiliary pixel PXa. However, embodiments are not limited thereto. A pixel circuit included in the main pixels PXm may be different from a pixel circuit included in the auxiliary pixels PXa.

The auxiliary pixels PXa may not be positioned in the transmission area TA. The auxiliary pixels PXa that are not positioned in the transmission area TA, may mean that a display element, such as an organic light-emitting diode OLED of the auxiliary pixels PXa, may not be included. That is, a pixel electrode, an intermediate layer, and an opposite electrode, which constitute an organic light-emitting diode OLED, and a pixel circuit electrically connected thereto may not be positioned in the transmission area TA. A part of signal lines PL, DL, SL, and EL connected so as to supply signals to the auxiliary pixels PXa positioned in the pixel area PA may cross the transmission area TA. However, even in this case, in order to improve the transmittance of the transmission area TA, the signal lines PL, DL, SL, and EL may bypass the center of the transmission area TA.

According to some example embodiments, a conductive layer may also be positioned on the substrate 100 so as to correspond to the pixel area PA of the auxiliary display area SA. The conductive layer may be positioned under the auxiliary pixels PXa, for example, between a thin-film transistor of the auxiliary pixels PXa and the substrate. The conductive layer may block external light emitted from the component 20 to be incident on the pixel circuit (see, e.g., PC in FIG. 5) of the auxiliary pixels PXa and may prevent or reduce the effects thereof. A constant voltage or signal may be applied to the conductive layer so that damage to the pixel circuit PC due to electrostatic discharge may be prevented or reduced. A plurality of conductive layers may be provided in the auxiliary display area SA. Different voltages may be supplied to the plurality of conductive layers according to circumstances.

Referring back to FIG. 3, each of the main and auxiliary pixels PXm and PXa may be electrically connected to outer circuits positioned in the non-display area NDA. A first scan driving circuit 110, a second scan driving circuit 120, a terminal 140, a data driving circuit 150, a first power supply line 160, and a second power supply line 170 may be positioned in the non-display area NDA.

The first scan driving circuit 110 may provide a scan signal to each of the main and auxiliary pixels PXm and PXa via the scan line SL. The first scan driving circuit 110 may provide an emission control signal to each pixel via an emission control line EL. The second scan driving circuit 120 may be positioned in parallel to the first scan driving circuit 110 with the main display area DA between the second scan driving circuit 120 and the first scan driving circuit 110. Some of the main and auxiliary pixels PXm and PXa in the main display area DA may be electrically connected to the first scan driving circuit 110, and the others of the main and auxiliary pixels PXm and PXa in the main display area DA may be connected to the second scan driving circuit 120. According to some example embodiments, the second scan driving circuit 120 may be omitted.

The terminal 140 may be positioned at one side of the substrate 100. The terminal 140 may not be covered by an insulating layer but may be exposed and electrically connected to a printed circuit board (PCB). A PCB-P of the PCB may be electrically connected to the terminal 140 of the display panel 10. The PCB transmits a signal or power of a controller to the display panel 10. The control signal generated by the controller may be transmitted to each of the first and second scan driving circuits 110 and 120 via the PCB. The controller may provide first and second power supply voltages (see ELVDD and ELVSS of FIGS. 5 and 6 to be described below) to first and second power supply lines 160 and 170 via first and second connection wires 161 and 171. The first power supply voltage ELVDD may be provided to each of the main and auxiliary pixels PXm and PXa via a driving voltage line PL connected to the first power supply line 160, and the second power supply voltage ELVSS may be provided to an opposite electrode of each of the main and auxiliary pixels PXm and PXa connected to the second power supply line 170.

The data driving circuit 150 is electrically connected to a data line DL. The data signal of the data driving circuit 150 may be provided to each of the main and auxiliary pixels PXm and PXa via a connection wire 151 connected to the terminal 140 and the data line DL connected to the connection wire 151. FIG. 3 illustrates the data driving circuit 150 positioned on the PCB. However, according to some example embodiments, the data driving circuit 150 may be positioned on the substrate 100. For example, the data driving circuit 150 may be between the terminal 140 and the first power supply line 160.

The first power supply line 160 may include a first sub-line 162 and a second sub-line 163, which extend in parallel to each other in an x-direction, with the main display area DA between the first sub-line 162 and the second sub-line 163. The second power supply line 170 may have a loop shape with one open side and may partially surround the main display area DA.

Figure 5:
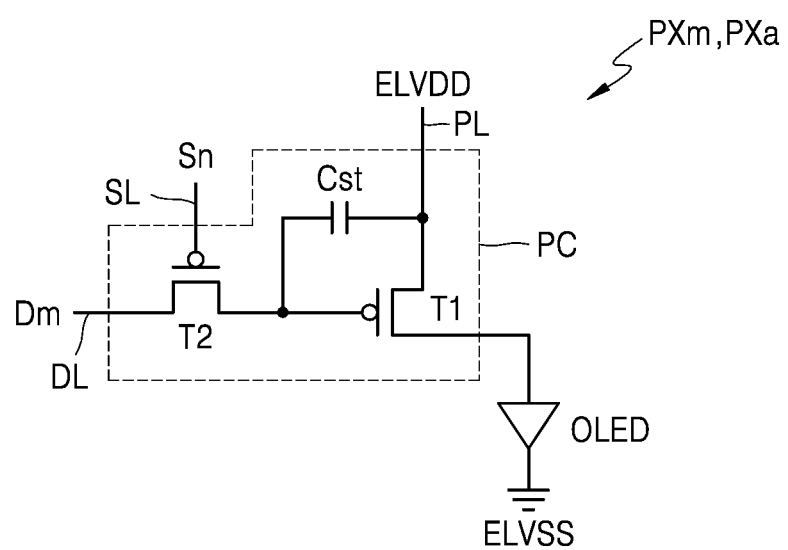
FIGS. 5 and 6 are equivalent circuit diagrams of a main pixel and/or an auxiliary pixel that may be included in the display panel according to some example embodiments.
Figure 6:
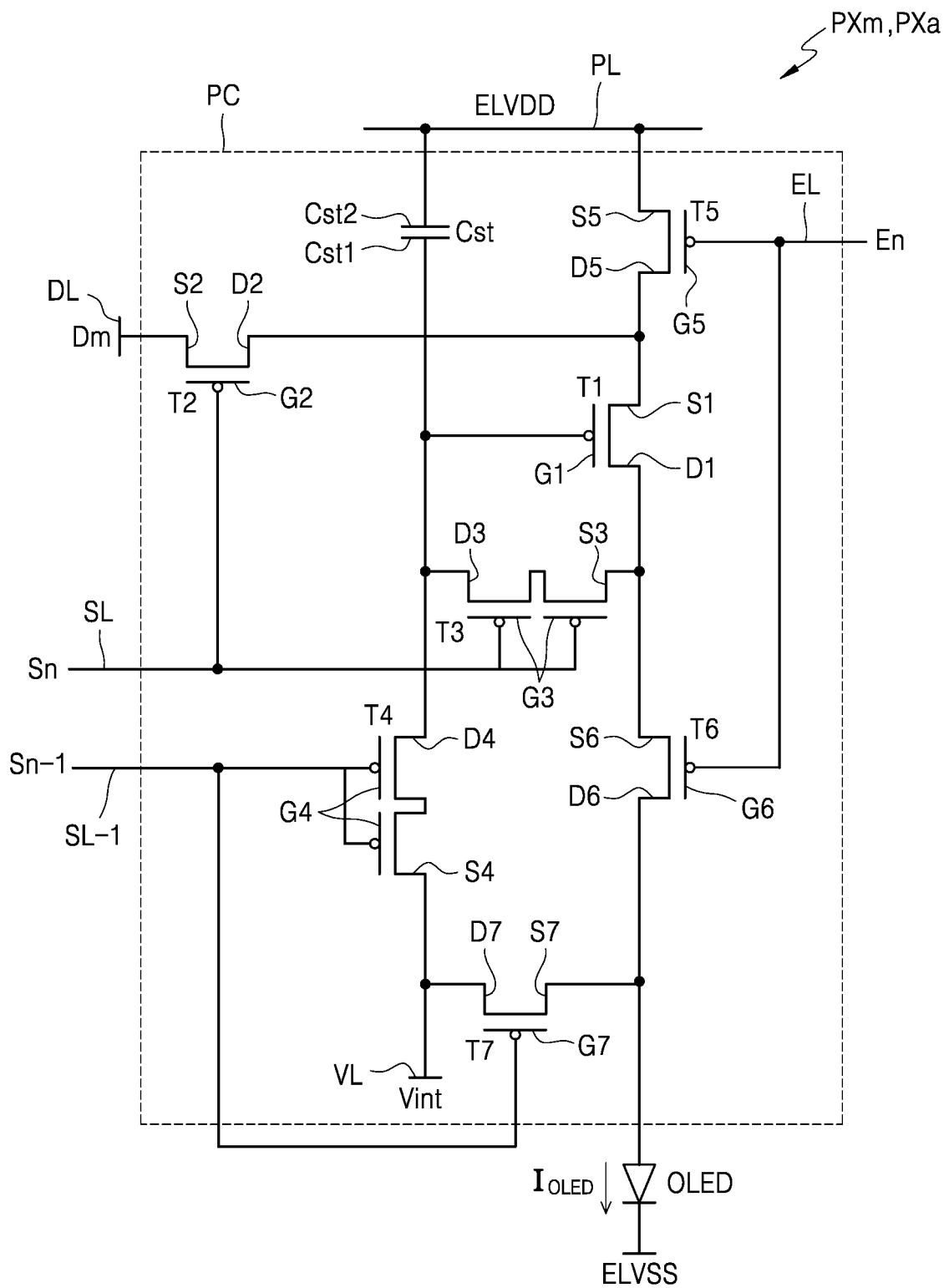

FIGS. 5 and 6 are equivalent circuit diagrams of main pixels and/or auxiliary pixels that may be included in a display panel according to some example embodiments.

A pixel circuit PC includes a driving thin-film transistor (TFT)) T1, a switching TFT T2, and a storage capacitor Cst. The switching TFT T2 may be connected to the scan line SL and the data line DL and may transmit a data signal Dm input through the data line DL to the driving TFT T1 according to a scan signal Sn input through the scan line SL.

The storage capacitor Cst is connected to the switching TFT T2 and the driving voltage line PL and stores a voltage that corresponds to a difference between a voltage transmitted from the switching TFT T2 and the first power supply voltage (or a driving voltage) ELVDD supplied to the driving voltage line PL.

The driving TFT T1 may be connected to the driving voltage line PL and the storage capacitor Cst and may control a driving current that flows through the organic light-emitting diode OLED from the driving voltage line PL in correspondence with a voltage value stored in the storage capacitor Cst. The organic light-emitting diode OLED may emit light having certain brightness according to the driving current.

In FIG. 6, the pixel circuit PC includes two TFTs and one storage capacitor. However, embodiments are not limited thereto. As shown in FIG. 6, the pixel circuit PC may include seven TFTs and one storage capacitor. In FIG. 6, the pixel circuit PC includes one storage capacitor. However, the pixel circuit PC may include two or more storage capacitors.

Referring to FIG. 6, each of the main and auxiliary pixels PXm and PXa includes the pixel circuit PC and an organic light-emitting diode OLED connected to the pixel circuit PC. The pixel circuit PC may include a plurality of TFTs and a storage capacitor. The plurality of TFTs and the storage capacitor may be connected to signal lines SL, SL−1, EL, and DL, an initialization voltage line VL, and the driving voltage line PL.

In FIG. 6, each of the main and auxiliary pixels PXm and PXa is connected to the signal lines SL, SL−1, EL, and DL, the initialization voltage line VL, and the driving voltage line PL. However, embodiments are not limited thereto. According to some example embodiments, at least one of the signal lines SL, SL−1, EL, and DL, the initialization voltage line VL, and the driving voltage line PL may be shared with adjacent pixels.

The signal lines may include the scan line SL for transmitting the scan signal Sn, a previous scan line SL−1 for transmitting the previous scan signal Sn−1 to the first initialization TFT T4 and the second initialization TFT T7, the emission control line EL for transmitting the emission control signal En to the operation control TFT T5 and the emission control TFT T6, and the data line DL that intersects with the scan line SL and transmits the data signal Dm. The driving voltage line PL transmits the driving voltage ELVDD to the driving TFT T1, and the initialization voltage line VL transmits an initialization voltage Vint for initializing the driving TFT T1 and a pixel electrode of an organic light-emitting diode OLED.

A driving gate electrode G1 of the driving TFT T1 may be connected to a lower electrode Cst1 of the storage capacitor plate Cst, and a driving source electrode S1 of the driving TFT T1 may be connected to a lower driving voltage line PL via the operation control TFT T5, and a driving drain electrode D1 of the driving TFT T1 may be electrically connected to the pixel electrode of the organic light-emitting diode OLED via the emission control TFT T6. The driving TFT T1 may receive the data signal Dm according to a switching operation of the switching TFT T2 and supply a driving current IDLED to the organic light-emitting diode OLED.

A switching gate electrode G2 of the switching TFT T2 may be connected to the scan line SL, and a switching source electrode S2 of the switching TFT T2 may be connected to the data line DL, and a switching drain electrode D2 of the switching TFT T2 may be connected to the driving source electrode S1 of the driving TFT T1 and connected to the lower driving voltage line PL via the operation control TFT T5. The switching TFT T2 may be turned on according to the scan signal Sn transmitted via the scan line SL and may perform a switching operation of transmitting the data signal Dm transmitted via the data line DL to the driving source electrode S1 of the driving TFT T1.

A compensation gate electrode G3 of the compensation TFT T3 may be connected to the scan line SL, a compensation source electrode S3 of the compensation TFT T3 may be connected to the driving drain electrode D1 of the driving TFT T1 and connected to the pixel electrode of the organic light-emitting diode OLED via the emission control TFT T6, and a compensation drain electrode D3 of the compensation TFT T3 may be connected to a lower electrode Cst1 of the storage capacitor Cst, the first initialization drain electrode D4 of the first initialization TFT T4, and the driving gate electrode G1 of the driving TFT T1. The compensation TFT T3 may be turned on according to the scan signal Sn transmitted via the scan line SL and may electrically connect the driving gate electrode G1 to the driving drain electrode D1 of the driving TFT T1, thereby diode-connecting the driving TFT T1.

A first initialization gate electrode G4 of the first initialization TFT T4 may be connected to the previous scan line SL−1, and a first initialization source electrode S4 of the first initialization TFT T4 may be connected to a second initialization drain electrode D7 of the second initialization TFT T7 and the initialization voltage line VL, and a first initialization drain electrode D4 of the first initialization TFT T4 may be connected to the lower electrode Cst1 of the storage capacitor Cst, the compensation drain electrode D3 of the compensation TFT T3, and the driving gate electrode G1 of the driving TFT T1. The first initialization TFT T4 may be turned on according to the previous scan signal Sn−1 transmitted via the previous scan line SL−1 and may perform an initialization operation of transmitting the initialization voltage Vint to the driving gate electrode G1 of the driving TFT T1 so as to initialize the voltage of the driving gate electrode G1 of the driving TFT T1.

An operation control gate electrode G5 of the operation control TFT T5 may be connected to the emission control line EL, and an operation control source electrode S5 of the operation control TFT T5 may be connected to the lower driving voltage line PL, and an operation control drain electrode D5 of the operation control TFT T5 may be connected to the driving source electrode S1 of the driving TFT T1 and the switching drain electrode D2 of the switching TFT T2.

An emission control gate electrode G6 of the emission control TFT T6 may be connected to the emission control line EL, and an emission control source electrode S6 of the emission control TFT T6 may be connected to the driving drain electrode D1 of the driving TFT T1 and the compensation source electrode S3 of the compensation TFT T3, and an emission control drain electrode D6 of the emission control TFT T6 may be electrically connected to the second initialization source S7 of the second initialization TFT T7 and the pixel electrode of the organic light-emitting diode OLED.

The operation control TFT T5 and the emission control TFT T6 may be simultaneously turned on according to the emission control signal En transmitted via the emission control line EL, and thus, the driving voltage ELVDD may be transmitted to the main OLED and the driving current IDLED may flow through the organic light-emitting diode OLED.

A second initialization gate electrode G7 of the second initialization TFT T7 may be connected to the previous scan line SL−1, and a second initialization source electrode S7 of the second initialization TFT T7 may be connected to the emission control drain electrode D6 of the emission control TFT T6 and the pixel electrode of the organic light-emitting diode OLED, and a second initialization drain electrode D7 of the second initialization TFT T7 may be connected to the first initialization source electrode S4 of the first initialization TFT T4 and the initialization voltage line VL. The second initialization TFT T7 may be turned on according to the previous scan signal Sn−1 transmitted via the previous scan line SL−1 and may initialize the pixel electrode of the organic light-emitting diode OLED.

In FIG. 6, the first initialization TFT T4 and the second initialization TFT T7 are connected to the previous scan line SL−1. However, embodiments are not limited thereto. According to some example embodiments, the first initialization TFT T4 may be connected to the previous scan line SL−1 and may be driven according to the previous scan signal Sn−1, and the second initialization TFT T7 may be connected to an additional signal line, for example, a subsequent scan line, and may be driven according to a signal to be transmitted to the signal line.

An upper electrode Cst2 of the storage capacitor Cst may be connected to the driving voltage line PL, and an opposite electrode of the organic light-emitting diode OLED may be connected to a common voltage ELVSS. Thus, the organic light-emitting diode OLED may receive the driving current IDLED from the driving TFT T1 and may emit light, thereby displaying an image.

In FIG. 6, the compensation TFT T3 and the first initialization TFT T4 have dual gate electrodes. However, the compensation TFT T3 and the first initialization TFT T4 may have one gate electrode.

Figure 7:
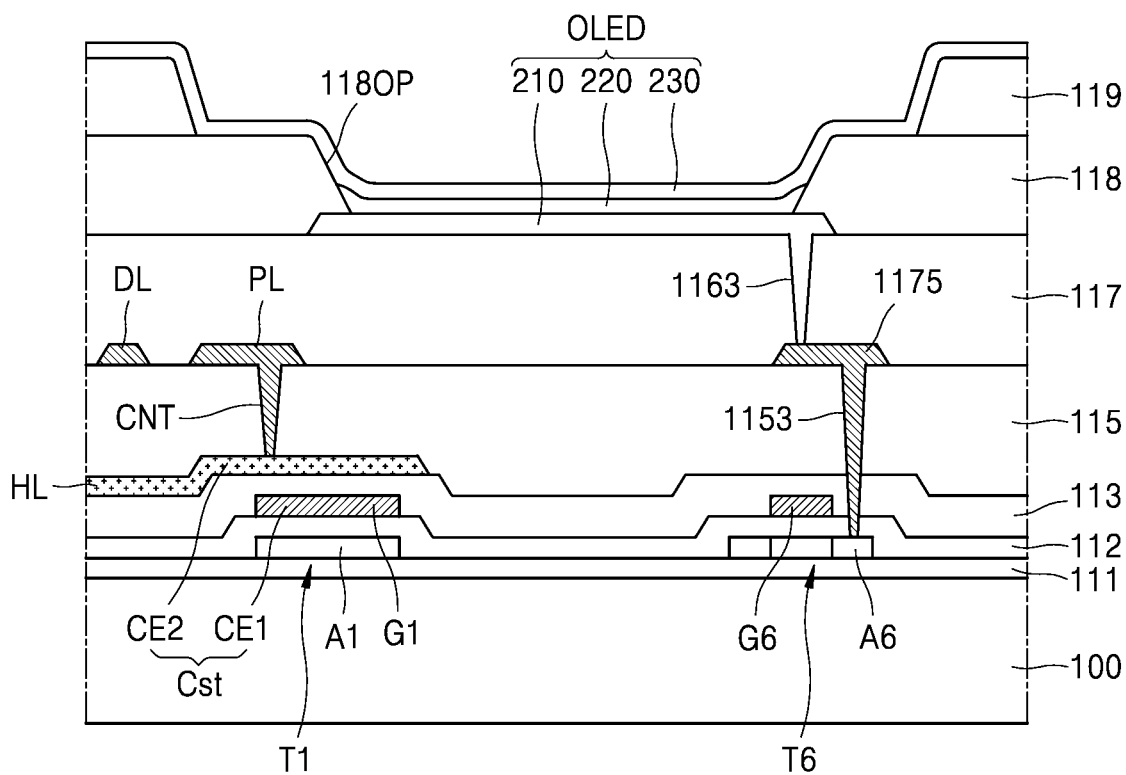
FIG. 7 is a cross-sectional view schematically illustrating a stack structure of a main pixel and/or an auxiliary pixel that may be included in the display panel according to some example embodiments.

FIG. 7 is a cross-sectional view schematically illustrating a stack structure of main pixels and/or auxiliary pixels that may be included in a display panel according to some example embodiments.

Hereinafter, the stack structure of one pixel according to some example embodiments will be described with reference to FIG. 7.

The substrate 100 may include glass or polymer resin. The polymer resin may include PES, polyacrylate, PEI, PEN, PET, polyphenylene sulfide PPS, polyarylate, PI, PC, or CAP. The substrate 100 including the polymer resin may be flexible, rollable, or bendable. The substrate 100 may have a multi-layer structure including a layer including the above-described polymer resin and an inorganic layer.

The buffer layer 111 may be positioned on the substrate 100, may reduce or prevent penetration of foreign substances, moisture, and/or external air from below the substrate 100 and may provide a flat surface to the substrate 100. The buffer layer 111 may include an inorganic material, such as an oxide or a nitride, an organic material, or an organic/inorganic compound and may have a single layer or multi-layer structure including the inorganic material and the organic material. A barrier layer for preventing or reducing penetration of external air may be further included between the substrate 100 and the buffer layer 111.

Gate electrodes G1 and G6 are positioned on semiconductor layers A1 and A6 with a first gate insulating layer 112 between the gate electrodes G1 and G6 and the semiconductor layers A1 and A6. The gate electrodes G1 and G6 may include molybdenum (Mo), aluminum (Al), copper (Cu), Ti, and the like and may have a single layer or multi-layer structure. In an example, the gate electrodes G1 and G6 may have a single layer structure of Mo. The scan line SL, the previous scan line SL−1, and the emission control line EL may be formed on the same layer as the gate electrodes G1 and G6. That is, the gate electrodes G1 and G6, the scan line SL, the previous scan line SL−1, and the emission control line EL may be positioned on the first gate insulating layer 112.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second gate insulating layer 113 may be provided to cover the gate electrodes G1 and G6. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The lower electrode Cst1 of the storage capacitor Cst may be formed as one body with the gate electrode G1 of the driving TFT T1. For example, the gate electrode G1 of the driving TFT T1 may function as the lower electrode Cst1 of the storage capacitor Cst.

The upper electrode Cst2 of the storage capacitor Cst overlaps the lower electrode Cst1 with the second gate insulating layer 113 between the upper electrode Cst2 of the storage capacitor Cst and the second gate insulating layer 113. In this case, the second gate insulating layer 113 may function as a dielectric layer of the storage capacitor Cst. The upper electrode Cst2 may include a conductive material including Mo, Al, Cu, and Ti and have a multi-layer or single layer structure including the above-described materials. In an example, the upper electrode Cst2 may have a single layer structure of Mo or a multi-layer structure of Mo/Al/Mo.

In the drawings, the storage capacitor Cst overlaps the driving TFT T1. However, embodiments are not limited thereto. The storage capacitor Cst may be modified in various ways in which the storage capacitor Cst may not overlap the driving TFT T1.

The upper electrode Cst2 may function as an electrode voltage line HL. For example, a part of the electrode voltage line HL may be the upper electrode Cst2 of the storage capacitor Cst.

An interlayer insulating layer 115 may be provided to cover the upper electrode Cst2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In FIG. 7, the interlayer insulating layer 115 has a single layer structure. According to some example embodiments, the interlayer insulating layer 115 may also have a multi-layer structure.

The data line DL, the driving voltage line PL, and a contact metal 1175 may be positioned on the interlayer insulating layer 115. The data line DL, the driving voltage line PL, and the contact metal 1175 may include a conductive material including Mo, Al, Cu, and Ti and have a multi-layer or single layer structure including the above-described materials. In an example, the data line DL, the driving voltage line PL, and the contact metal 1175 may have a multi-layer structure of Ti/Al/Ti.

The upper electrode Cst2 of the storage capacitor Cst may be in contact with the driving voltage line PL via a contact hole CNT defined in the interlayer insulating layer 115. This may mean that the electrode voltage line HL is in contact with the driving voltage line PL via the contact hole CNT. Thus, the electrode voltage line HL may have the same voltage level (constant voltage) as that of the driving voltage line PL.

The contact metal 1175 is in contact with the semiconductor layer A6 of the emission control TFT T6 via a contact hole 1153 that penetrates into the interlayer insulating layer 115, the second gate insulating layer 113, and the first gate insulating layer 112. The emission control TFT T6 may be electrically connected to the pixel electrode 210 of the main organic light-emitting diode OLED via the contact metal 1175.

A planarization layer 117 is positioned on the data line DL, the driving voltage line PL, and the contact metal 1175. The main organic light-emitting diode OLED may be positioned on the planarization layer 117.

The planarization layer 117 may have a flat top surface on which the pixel electrode 210 may be flatly formed. The planarization layer 117 may have a single layer or multi-layer structure formed of an organic material. The planarization layer 117 may include general-purpose polymer such as benzocyclobutene (BCB), PI, hexamethyldisiloxane (HMDSO), polymethylmethacrylate (PMMA), or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, and a blend thereof. The planarization layer 117 may include an inorganic material. The planarization layer 117 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 117 includes an inorganic material, chemical planarization polishing may be performed according to circumstances. The planarization layer 117 may include both an organic material and an inorganic material.

The pixel electrode 210 may include a (semi-)light-transmitting electrode or reflective electrode. In some embodiments, the pixel electrode 210 may include a reflective layer formed of Ag, Mg, Al, Pt, Pd, Au, Ni, Nd, Ir, Cr, and a compound thereof, and a transparent or semitransparent electrode layer formed on the reflective layer. The transparent or semitransparent electrode layer may include at least one selected from the group consisting of indium tin oxide (ITO), indium zinc oxide (IZO), zinc oxide, indium oxide, indium gallium oxide (IGO), and aluminum zinc oxide (AZO). According to some example embodiments, the pixel electrode 210 may have a stack structure of ITO/Ag/ITO.

A pixel-defining layer 118 may be positioned on the planarization layer 117. The pixel-defining layer 118 may have an opening through which the center of the pixel electrode 210 is exposed, thereby defining an emission area of a pixel. Also, the pixel-defining layer 118 may increase a distance between edges of the pixel electrode 210 and an opposite electrode 230 at an upper portion of the pixel electrode 210, thereby preventing or reducing instances of an arc occurring in the edges of the pixel electrode 210. The pixel-defining layer 118 may be formed of an organic insulating material, such as PI, polyamide, acryl resin, BCB, HMDSO, and a phenol resin, using spin coating.

A barrier wall 119 may be positioned on the pixel-defining layer 118. The barrier wall 119 may decrease a distance between a mask and the pixel electrode 210 when an intermediate layer 220 is formed, thereby preventing or reducing color mixing. Also, the barrier wall 119 may decrease a distance between the mask and the intermediate layer 220 when an opposite electrode 230 is formed, thereby preventing the opposite electrode 230 from being formed with a large thickness. The barrier wall 119 may include an organic insulating material, such as PI, polyamide, acryl resin, BCB, HMDSO, and phenol resin and may be formed using a method such as spin coating.

The intermediate layer 220 of the organic light-emitting diode OLED may include an organic emission layer. The organic emission layer may include an organic material including a fluorescent or phosphorescent material that emits red light, green light, blue light, or white light. The organic emission layer may include a small molecular weight organic material or polymer organic material, and a functional layer, such as a hole transport layer (HTL), a hole injection layer (HIL), an electron transport layer (ETL), and an electron injection layer (EIL), may be optionally further positioned under/on the organic emission layer. The intermediate layer 220 may correspond to each of the plurality of pixel electrodes 210. However, embodiments are not limited thereto. There may be various modifications where the intermediate layer 220 includes a one-body layer overall in the plurality of pixel electrodes 210.

The opposite electrode 230 may include a light-transmitting electrode or reflective electrode. According to some example embodiments, the opposite electrode 230 may include a transparent or semi-transparent electrode and may include a metal thin layer having a small work function including lithium (Li), calcium (Ca), lithium fluoride (LiF)/Ca, LiF/Al, Al, silver (Ag), magnesium (Mg), and a compound thereof. Also, a transparent conductive oxide (TCO) layer, such as ITO, IZO, ZnO or $In_2O_3$, may be further positioned on the metal thin layer.

When the pixel electrode 210 includes a reflective electrode and the opposite electrode 230 includes a light-transmitting electrode, light emitted from the intermediate layer 220 may be emitted toward the opposite electrode 230, and thus, the display device may be of a top (front) emission type. When the pixel electrode 210 includes a transparent or semi-transparent electrode and the opposite electrode 230 includes a reflective electrode, light emitted from the intermediate layer 220 may be emitted toward the substrate 100, and thus, the display device may be of a bottom (rear) emission type. However, embodiments are not limited thereto. A display device according to some example embodiments may be of a dual emission type in which light is emitted in both directions such as front and rear directions.

According to some example embodiments, the opposite electrode 230 may be positioned overall on the entire surface of the main display area DA, and a part of the edges may be positioned in the non-display area NDA. The opposite electrode 230 may be formed of a one-body in the main pixels PXm positioned in the main display area DA, i.e., a plurality of organic light-emitting diodes OLED, and may correspond to a plurality of pixel electrodes 210.

The opposite electrode 230 is provided in the auxiliary pixels PXa positioned in the auxiliary display area SA. That is, the opposite electrode 230 of FIG. 7 may correspond to a first opposite electrode 230a or a second opposite electrode 230b of FIG. 8 to be described in more detail below.

However, the auxiliary display area SA may include a pixel area PA in which the auxiliary pixels PXa are placed and the transmission area TA. Thus, a part of the opposite electrode 230 may not be provided in a partial area that corresponds to the transmission area TA. In the case of a top (front) emission-type display device, light may be emitted toward the opposite electrode 230. However, the transmittance of the top (front) emission-type display device may be partially reduced due to the opposite electrode 230. Thus, the opposite electrode 230 is not provided in the area that corresponds to the transmission area TA, and thus, the transmittance of the transmission area TA may be improved.

To this end, the opposite electrode 230 in the auxiliary display area SA may be patterned according to the pixel area PA. The opposite electrode 230 in the auxiliary display area SA may be formed by removing the partial area corresponding to the transmission area TA using laser lift off, or by fine metal mask (FMM) patterning.

According to some example embodiments, the opposite electrode 230 is formed in the main display area DA and the auxiliary display area SA through FMM patterning.

Figure 8:
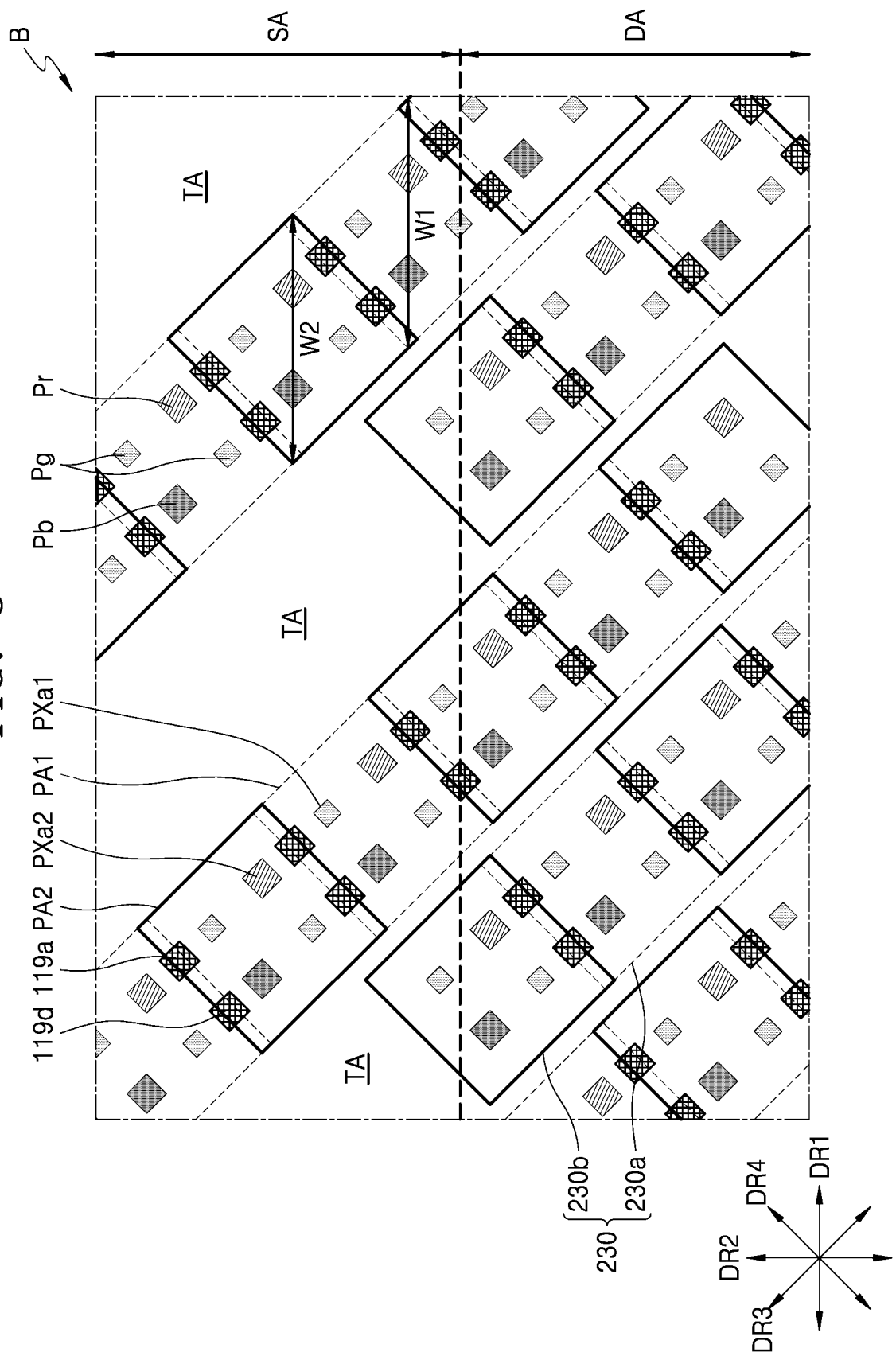
FIGS. 8 and 9 are plan views illustrating a part of an auxiliary display area according to some example embodiments.
Figure 9:
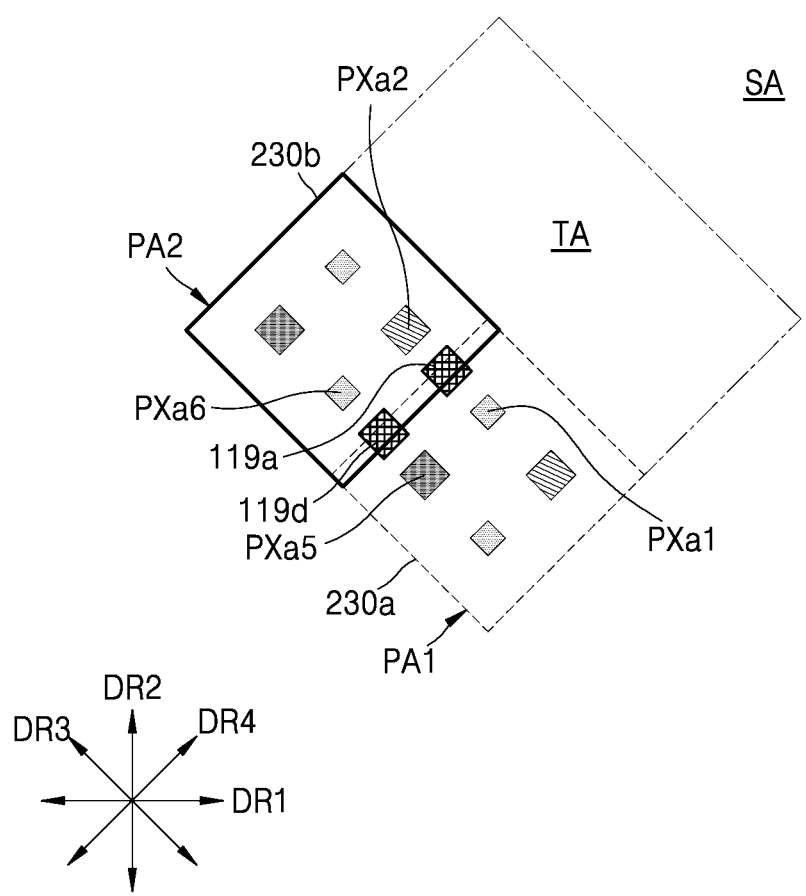
Figure 10:
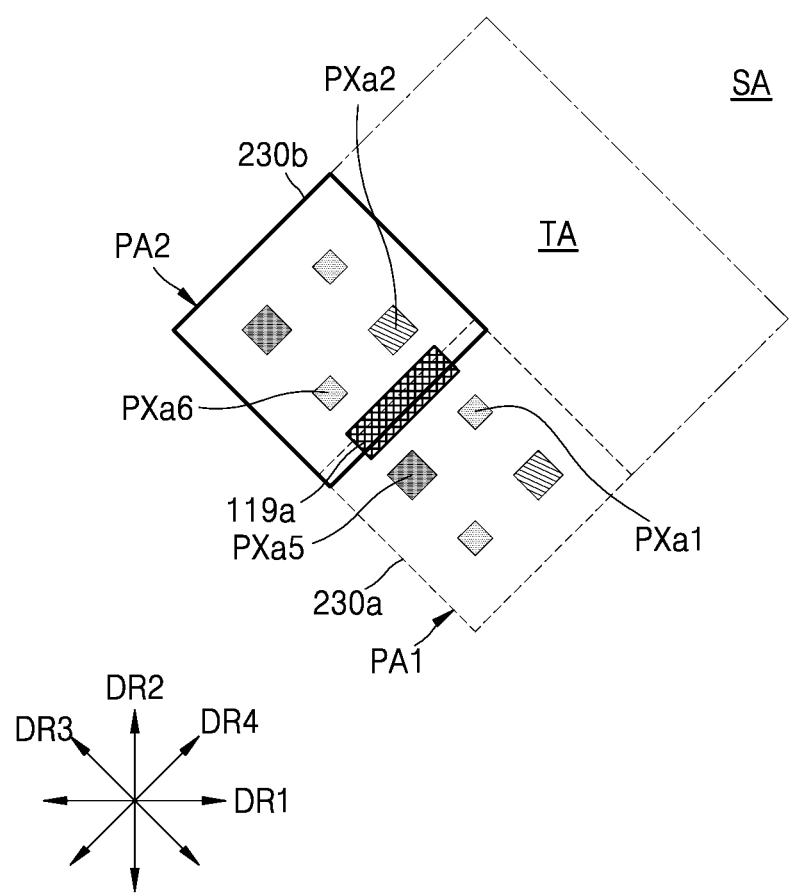
FIG. 10 is a plan view illustrating a part of an auxiliary display area according to some example embodiments.

FIGS. 8 and 9 are plan views illustrating a part of an auxiliary display area SA according to some example embodiments, and FIG. 10 is a plan view illustrating a part of an auxiliary display area SA according to some example embodiments. FIG. 8 may correspond to a region B of FIG. 3.

Referring to FIG. 8, the opposite electrode 230 in the main display area DA and the auxiliary display area SA may be formed through FMM patterning, and the auxiliary display area SA may include a pixel area PA and a transmission area TA, and auxiliary pixels PXa may be positioned in the pixel area PA.

The pixel area PA may include a first pixel area PA1 and a second pixel area PA2, as shown in FIG. 9, and a first pixel PXa1 and a fifth pixel PXa5 may be positioned in the first pixel area PA1, and a second pixel PXa2 and a sixth pixel PXa6 may be positioned in the second pixel area PA2.

The first pixel PXa1 may include a first pixel electrode 210a, a first opposite electrode 230a, and a first intermediate layer 220a between the first pixel electrode 210a and the first opposite electrode 230a. The second pixel PXa2 may include a second pixel electrode 210b, a second opposite electrode 230b, and a second intermediate layer 220b between the second pixel electrode 210b and the second opposite electrode 230b.

According to some example embodiments, the first opposite electrode 230a may be provided in the first pixel area PA1, and the second opposite electrode 230b may be provided in the second pixel area PA2. The first opposite electrode 230a may be positioned to correspond to the first pixel area PA1, and the second opposite electrode 230b may be positioned to correspond to the second pixel area PA2, and the first opposite electrode 230a and the second opposite electrode 230b may have an overlapping area in which at least some of the first opposite electrode 230a and the second opposite electrode 230b overlap each other on a first barrier wall 119a placed on the pixel-defining layer 118 between the first pixel PXa1 and the second pixel PXa2.

In this case, a distal end of the first opposite electrode 230a and a distal end of the second opposite electrode 230b that overlap each other on the first barrier wall 119a may be positioned on the first barrier wall 119a.

The barrier wall 119 according to some example embodiments may have a structure in which the first barrier wall 119a is between the first pixel PXa1 and the second pixel PXa2 and a fourth barrier wall 119d is between a fifth pixel PXa5 and a sixth pixel PXa6, as illustrated in FIG. 9. Alternatively, the barrier wall 119 according to some example embodiments may have a structure in which the first barrier wall 119a between the first pixel PXa1 and the second pixel PXa2 extends between the fifth pixel PXa5 and the sixth pixel PXa6, as illustrated in FIG. 10.

Referring back to FIG. 8, the first opposite electrode 230a positioned in the first pixel area PA1 may have a first width W1 in the first direction DR1 and may have a shape of a first rectangle, and the second opposite electrode 230b may have a shape of a second rectangle with a second width W2 in the first direction DR1. In this case, the first width W1 of the first opposite electrode 230a and the second width W2 of the second opposite electrode 230b may be substantially the same, and the shape of the first rectangle of the first opposite electrode 230a and the shape of the second rectangle of the second opposite electrode 230b may be substantially the same.

An overlapping area in which at least a part of the first opposite electrode 230a and at least a part of the second opposite electrode 230b overlap each other, may have a first reflectivity, and the first pixel area PA1 and the second pixel area PA2 other than the overlapping area may have a second reflectivity. In this case, because at least some of the first opposite electrode 230a and the second opposite electrode 230b overlap each other in the overlapping area, the first reflectivity of the overlapping area and the second reflectivity of the first pixel area PA1 and the second pixel area PA2 except for the overlapping area may be different from each other.

Auxiliary pixels PXa positioned in the first pixel PA1 may include a first opposite electrode 230a formed as a one body overall in at least one first pixel area PA1. The first opposite electrode 230a formed as a one body overall in at least one first pixel area PA1 may mean that the first opposite electrode 230a is formed through the same mask process. In FIG. 9, the first opposite electrode 230a is formed as a one body overall in one first pixel area PA1. However, the first opposite electrode 230a may be formed as a one body overall in two or more first pixel areas PA1.

Also, the auxiliary pixels PXa positioned in the second pixel area PA2 may include the second opposite electrode 230b formed as a one body overall in at least one second pixel area PA2. The second opposite electrode 230b formed as a one body overall in at least one second pixel area PA2 may mean that the second opposite electrode 230b is formed through the same mask process. In FIG. 9, the second opposite electrode 230b is formed as a one body overall in one second pixel area PA2. However, the second opposite electrode 230b may be formed as a one body overall in two or more second pixel areas PA2.

Figure 11:
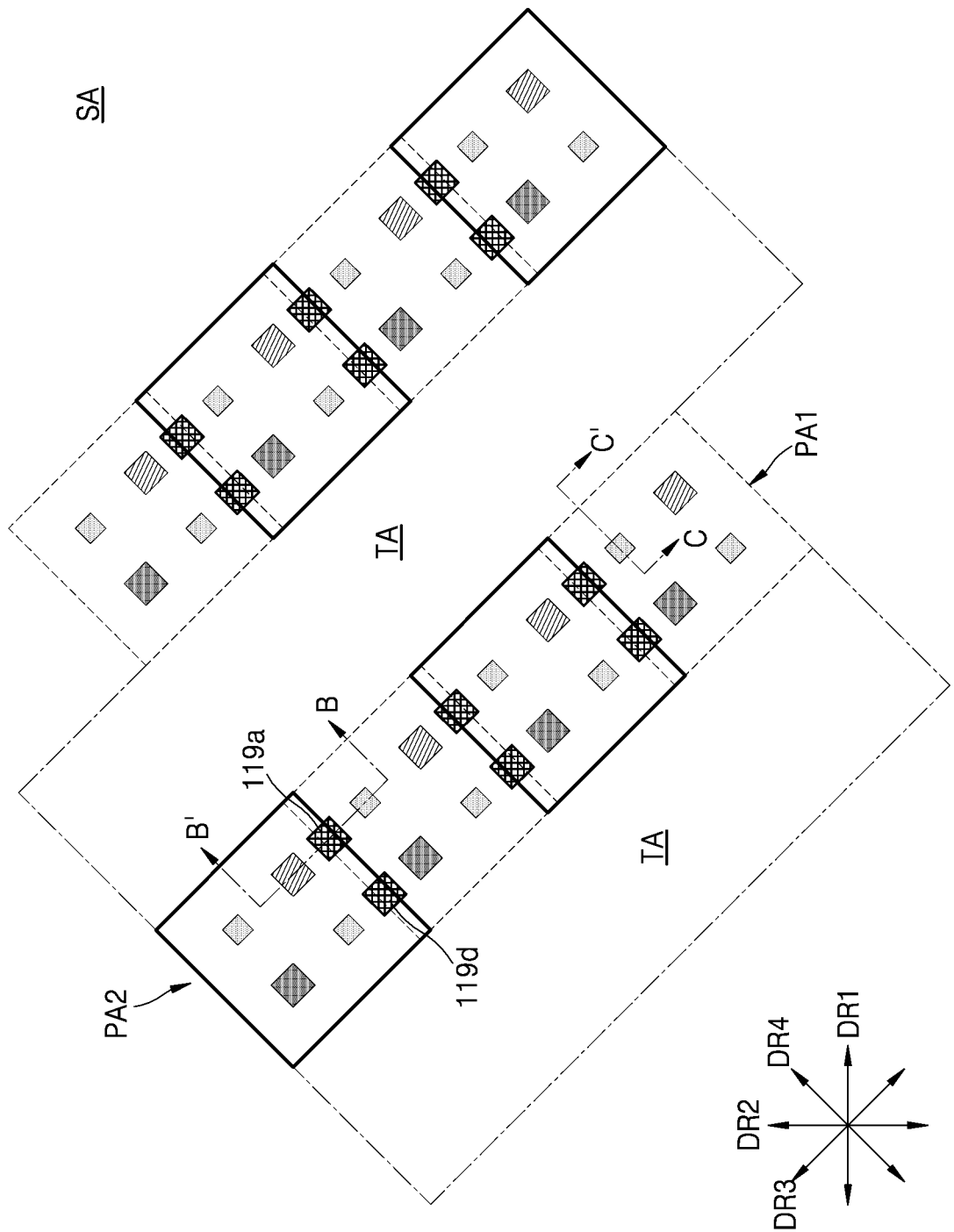
FIG. 11 is a plan view illustrating a part of an auxiliary display area according to some example embodiments.

FIG. 11 is a plan view illustrating a part of an auxiliary display area SA according to some example embodiments.

Referring to FIG. 11, a plurality of first pixel areas PA1, a plurality of second pixel areas PA2, and a plurality of transmission areas TA may be provided in the auxiliary display area SA. The plurality of first pixel areas PA1 and the plurality of second pixel areas PA2 may be placed in a third direction DR3, and the plurality of transmission areas TA may be placed in the third direction D3. Thus, the first pixel areas PA1, the second pixel areas PA2, and the transmission areas TA may be arranged to cross one another and may be arranged in a grid structure.

When the opposite electrode 230 is formed in the main display area DA through open mask patterning and the opposite electrode 230 is formed in the auxiliary display area SA through FMM patterning, shadow occurs in a boundary portion between the main display area DA and the auxiliary display area SA and the thickness of the opposite electrode 230 varies and as such, abnormality of color coordinates occurs.

Also, as resolution increases, a gap of the pixel-defining layer 118 may be reduced. Thus, an overlapping section in which the opposite electrodes 230 may be in electric contact with one another, is insufficient and as such, a dark wire may be generated. Due to a shadow, different types of opposite electrodes 230 may be additionally formed in an emission area of an organic light-emitting diode OLED and finally, the thickness of the opposite electrode 230 may vary and abnormality of color coordinates may occur.

Thus, according to some example embodiments, while the opposite electrodes 230 are formed in the main display area DA and the auxiliary display area SA through FMM patterning, the barrier wall 119 is positioned on the pixel-defining layer 118, and as such, the opposite electrode 230 may be formed to a relatively uniform thickness in the emission area of the organic light-emitting diode OLED.

Figure 12:
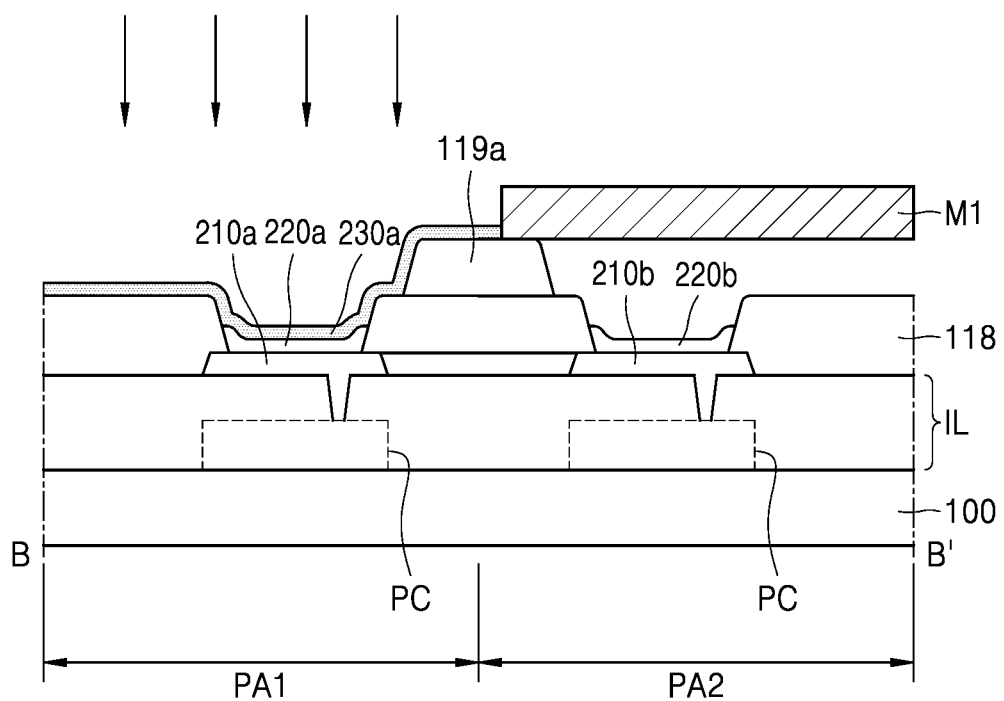
FIGS. 12 and 13 are cross-sectional views schematically illustrating a part of a process of manufacturing a display panel according to some example embodiments.
Figure 13:
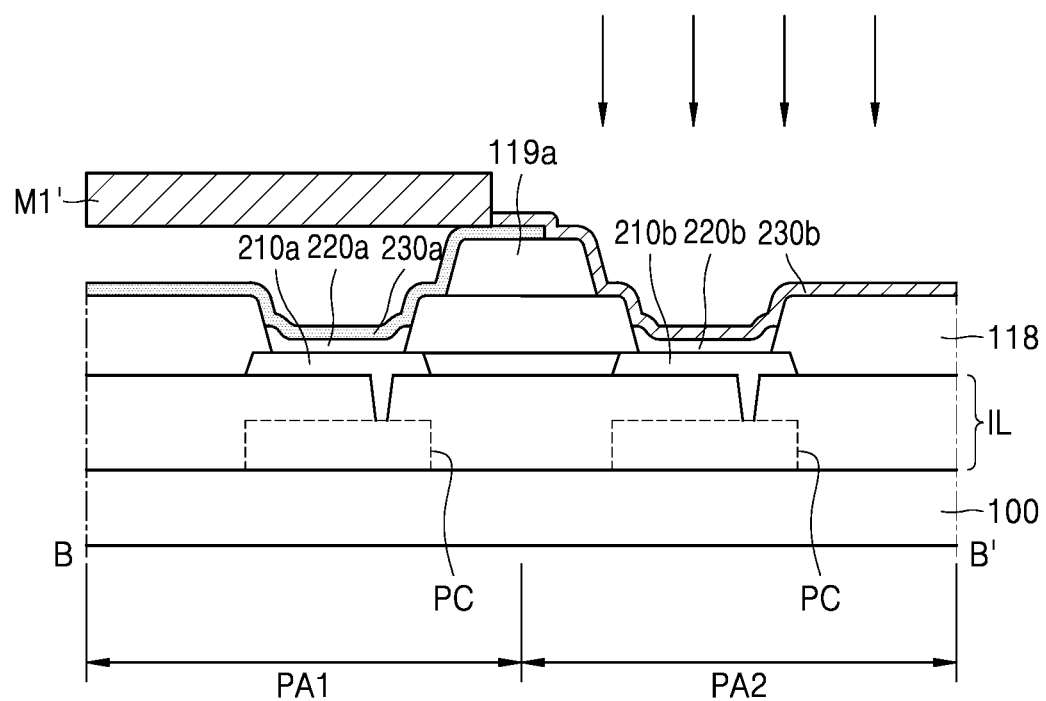
Figure 14:
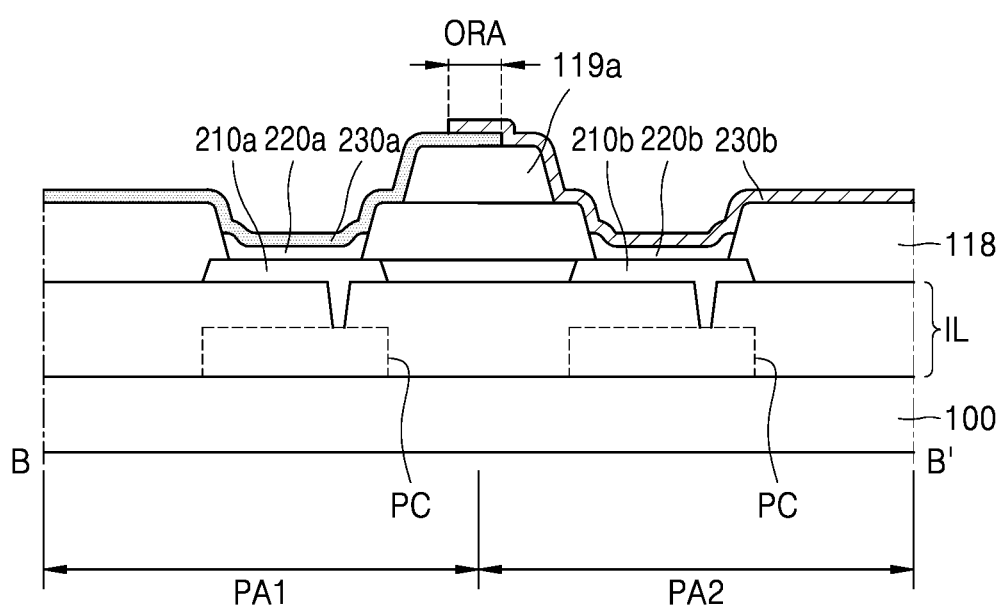
FIG. 14 is a cross-sectional view schematically illustrating a cross-section of the auxiliary display area taken along a line B-B' of FIG. 11.
Figure 15:
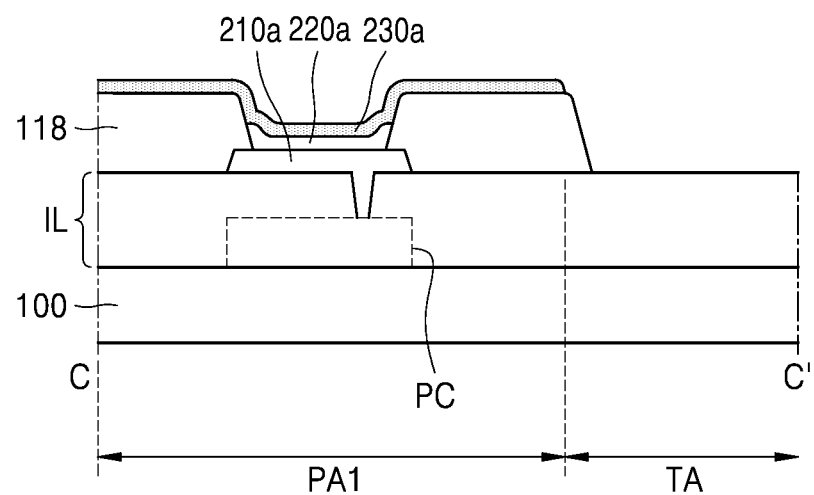
FIG. 15 is a cross-sectional view schematically illustrating a cross-section of the auxiliary display area taken along a line C-C' of FIG. 11.

FIGS. 12 and 13 are cross-sectional views schematically illustrating a part of a process of manufacturing the display panel 10 according to some example embodiments, and FIG. 14 is a cross-sectional view schematically illustrating a cross-section of the auxiliary display area SA taken along a line B-B' of FIG. 11, and FIG. 15 is a cross-sectional view schematically illustrating a cross-section of the auxiliary display area SA taken along a line C-C' of FIG. 11.

Referring to FIG. 12, an insulating layer IL in which a pixel circuit PC is placed, is formed on the substrate 100, and a first pixel electrode 210a and a second pixel electrode 210b are formed to be electrically connected to the pixel circuit PC. The first pixel electrode 210a is positioned in the first pixel area PA1, and the second pixel electrode 210b is positioned in the second pixel area PA2.

The pixel-defining layer 118 having openings for exposing the center of the first pixel electrode 210a and the second pixel electrode 210b is formed on the first pixel electrode 210a and the second pixel electrode 210b, and a first barrier wall 119a is formed on the pixel-defining layer 118. A first intermediate layer 220a is formed on the first pixel electrode 210a exposed through the openings of the pixel-defining layer 118, and a second intermediate layer 220b is formed on the second pixel electrode 210b. The first intermediate layer 220a and the second intermediate layer 220b may include the same material as that of the intermediate layer 220 described above.

Subsequently, the first opposite electrode 230a and the second opposite electrode 230b may be formed on the first intermediate layer 220a and the second intermediate layer 220b. According to some example embodiments, the first opposite electrode 230a and the second opposite electrode 230b may be formed through a FMM process.

When the first opposite electrode 230a is formed on the first intermediate layer 220a, as shown in FIG. 12, the first mask M1 is in close contact with the first barrier wall 119a. Thus, a part of the first opposite electrode 230a may be formed in the second pixel area PA2, and the first opposite electrode 230a may be prevented from being formed on the second intermediate layer 220b.

After the first opposite electrode 230a is formed, when a second opposite electrode 230b is formed on the second intermediate layer 220b, as shown in FIG. 13, a first' mask M1' is in close contact with the first barrier wall 119a and the first opposite electrode 230a. Thus, a part of the second opposite electrode 230b may be formed in the first pixel area PA1, and the second opposite electrode 230b may be prevented from being formed on the first intermediate layer 220a.

In this case, the first mask M1 and the first' mask M1' are the same mask, and after a first opposite electrode 230a is formed using the first mask M1, the first mask M1 may be shifted in the third direction DR3 to form the second opposite electrode 230b.

Referring to FIG. 14, an overlapping area ORA in which at least a part of the first opposite electrode 230a and the second opposite electrode 230b overlap each other, may be on the first barrier wall 119a. The first opposite electrode 230a and the second opposite electrode 230b may be in surface contact with each other through the overlapping area ORA and thus may be in electric contact with each other. The first opposite electrode 230a and the second opposite electrode 230b being in surface contact with each other may mean that there is no layer between the first opposite electrode 230a and the second opposite electrode 230b and the second opposite electrode 230b is stacked on the first opposite electrode 230a and thus a top surface of the first opposite electrode 230a and a bottom surface of the second opposite electrode 230b are in contact with each other.

The second opposite electrode 230b may be positioned on the first opposite electrode 230a in the overlapping area ORA. This may mean that the second opposite electrode 230b is formed in a later process than the first opposite electrode 230a. The first opposite electrode 230a and the second opposite electrode 230b are in surface contact with each other, and thus, the overlapping area ORA may be formed to a thickness twice an area in which only the first opposite electrode 230a or the second opposite electrode 230b is positioned. Thus, the overlapping area ORA may not be placed in emission areas of the first pixel PXa1 and the second pixel PXa2. In this case, the emission areas may be formed in the pixel-defining layer 118 and may be respectively defined as first and second openings OP1 and OP2 through which each of centers of the first pixel electrode 210a and the second pixel electrode 210b is exposed.

When a deposition process using an FMM is performed, a first barrier wall 119a positioned in the pixel-defining layer 118 may prevent the first opposite electrode 230a from being formed on the second intermediate layer 220b and prevent the second opposite electrode 230b from being formed on the first intermediate layer 220a. The first opposite electrode 230a and the second opposite electrode 230b may overlap each other on the first barrier wall 119a, and a distal end of the first opposite electrode 230a and a distal end of the second opposite electrode 230b that overlap each other on the first barrier wall 119a may be placed on the first barrier wall 119a. That is, the overlapping area ORA may be provided or arranged so as to not overlap the first and second openings OP1 and OP2 formed in the pixel-defining layer 118.

Referring to FIGS. 9 and 15, the transmission area TA may not include a display element, such as an organic light-emitting diode OLED, and a pixel circuit PC electrically connected thereto, compared to the first pixel area PA1. Furthermore, the transmission area TA may be defined as an area in which a part of layers arranged on the substrate 100 is removed. As shown in FIG. 15, the transmission area TA may be defined as an opening formed in the pixel-defining layer 118. According to some example embodiments, a part of the insulating layer IL under the pixel-defining layer 118 may be further removed in accordance with the transmission real TA.

Figure 16:
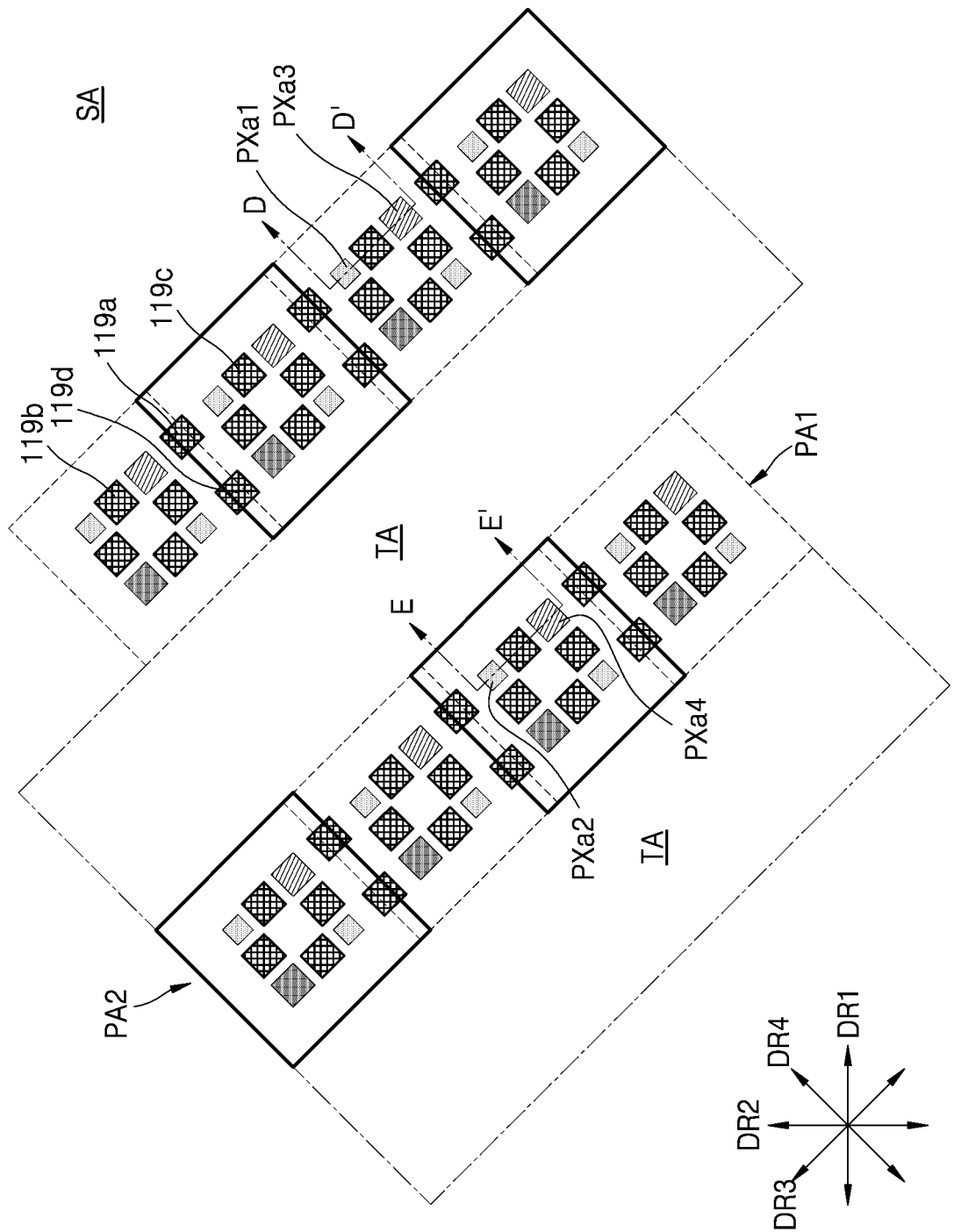
FIG. 16 is a plan view illustrating a part of an auxiliary display area according to some example embodiments.
Figure 17:
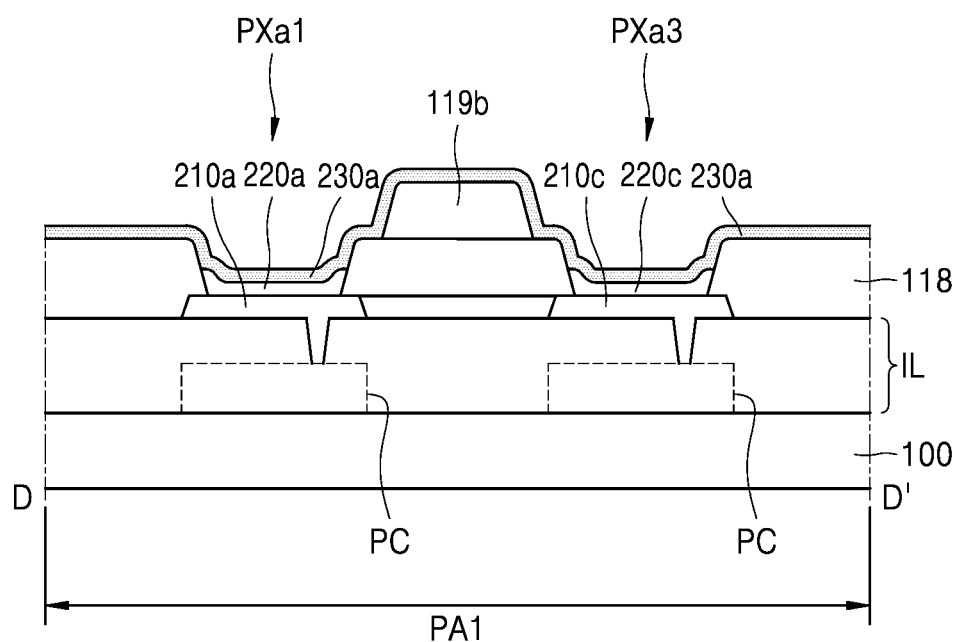
FIG. 17 is a cross-sectional view schematically illustrating a cross-section of the auxiliary display area taken along a line D-D' of FIG. 16.
Figure 18:
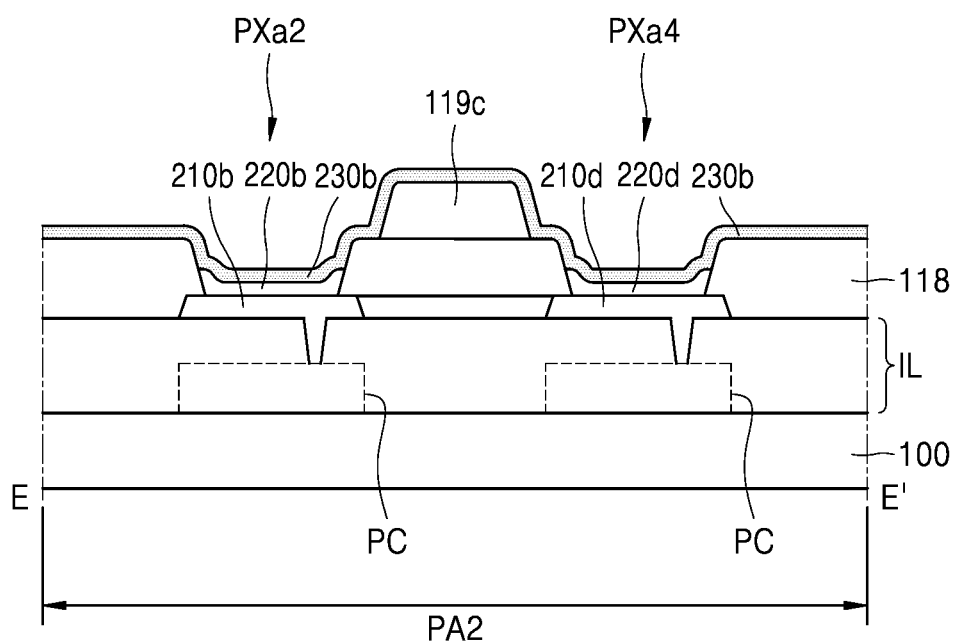
FIG. 18 is a cross-sectional view schematically illustrating a cross-section of the auxiliary display area taken along a line E-E' of FIG. 16.

FIG. 16 is a plan view illustrating a part of an auxiliary display area SA according to some example embodiments, FIG. 17 is a cross-sectional view schematically illustrating a cross-section of the auxiliary display area SA taken along a line D-D' of FIG. 16, and FIG. 18 is a cross-sectional view schematically illustrating a cross-section taken of the auxiliary display area SA along a line E-E' of FIG. 16.

Referring to FIG. 16, a barrier wall 119 may be between auxiliary pixels PXa of the auxiliary display area SA according to some example embodiments. The barrier wall 119 between the auxiliary pixels PXa may prevent or reduce color mixing due to mixing of emission materials when an intermediate layer 220 is formed on a pixel electrode 210. Hereinafter, this will be described in more detail with reference to FIGS. 17 and 18.

A display panel 10 according to some example embodiments may be placed in a first pixel area PA1 and may further include a third pixel PXa3. Referring to FIG. 17, the third pixel PXa3 may include a third pixel electrode 210c, a third intermediate layer 220c placed on the third pixel electrode 210c, and a first opposite electrode 230a placed in a first pixel area PA1 to correspond to the third intermediate layer 220c and may further include a second barrier wall 119b placed in the pixel-defining layer 118 between the first pixel PXa1 and the third pixel PXa3.

When a third intermediate layer 220c is formed on the third pixel electrode 210c, the second barrier wall 119b causes the fine metal mask FMM to be in close contact with the second barrier wall 119b, thereby preventing or reducing color mixing from occurring due to mixing of an organic material for forming the third intermediate layer 220c and an organic material for forming the first intermediate layer 220a.

Referring to FIG. 18, a fourth pixel PXa4 may include a fourth pixel electrode 210d, a fourth intermediate layer 220d placed on the fourth pixel electrode 210d, and a second opposite electrode 230b placed in the second pixel area PA2 to correspond to the fourth intermediate layer 220d and may further include a third barrier wall 119c placed in the pixel-defining layer between the second pixel PXa2 and the fourth pixel PXa4.

When a fourth intermediate layer 220d is formed on the fourth pixel electrode 210d, the third barrier wall 119c causes the fine metal mask FMM to be in close contact with the third barrier wall 119c, thereby preventing or reducing color mixing due to mixing of an organic material for forming the fourth intermediate layer 220d and an organic material for forming the second intermediate layer 220b.

The pixel area PA and the transmission area TA of the auxiliary display area SA may be formed in a second direction DR2. As the pixel area PA and the transmission area TA of the auxiliary display area SA are formed in the second direction DR2, the pixel area PA and the transmission area TA may be placed to cross in the first direction DR1.

The pixel area PA and the transmission area TA of the auxiliary display area SA may be provided in various forms except in the above-described embodiments. Also, the first opposite electrode 230a and the second opposite electrode 230b may be provided in various forms except in the above-described embodiments.

According to one or more embodiments, in order to solve the problem in which abnormality of color coordinates occurs in a boundary portion between an auxiliary display area in which components are placed and a main display area in which a plurality of pixels are placed, of a display panel and a display device including the same according to the related art, opposite electrodes are formed in an auxiliary display area in which components are arranged, and a main display area in which a plurality of main pixels are positioned, by using a barrier wall so that a display panel having improved quality and a display device including the same can be provided.

Until now, only the display panel and the display device including the same have been mainly described. However, embodiments are not limited thereto. For example, a method of manufacturing a display device, for manufacturing the display device will also belong to the scope of the present disclosure.

As described above, in one or more embodiments of the present disclosure, opposite electrodes are formed using a barrier wall in an auxiliary display area in which components are arranged, and in a main display area in which a plurality of main pixels are arranged, so that a display panel having improved quality and a display device including the same can be implemented. The scope of the present disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display panel comprising:
    a substrate comprising a main display area and an auxiliary display area comprising a first pixel area, a second pixel area, and a transmission area;
    a first pixel in the first pixel area and comprising a first pixel electrode, a first opposite electrode, and a first intermediate layer between the first pixel electrode and the first opposite electrode;
    a second pixel in the second pixel area and comprising a second pixel electrode, a second opposite electrode, and a second intermediate layer between the second pixel electrode and the second opposite electrode;
    a pixel-defining layer on the first pixel electrode and the second pixel electrode and having a first opening and a second opening through which centers of the first pixel electrode and the second pixel electrode are respectively exposed; and
    a first barrier wall on the pixel-defining layer between the first pixel and the second pixel and having a top surface on which the first opposite electrode and the second opposite electrode overlap each other.

2. The display panel of claim 1, further comprising a third pixel in the first pixel area, wherein the third pixel comprises a third pixel electrode, a third intermediate layer on the third pixel electrode, and the first opposite electrode in the first pixel area corresponding to the third intermediate layer.

3. The display panel of claim 2, further comprising a second barrier wall on the pixel-defining layer between the first pixel and the third pixel.

4. The display panel of claim 3, wherein the first opposite electrode is on a top surface of the second barrier wall.

5. The display panel of claim 1, further comprising a fourth pixel in the second pixel area, wherein the fourth pixel comprises a fourth pixel electrode, a fourth intermediate layer on the fourth pixel electrode, and the second opposite electrode in the second pixel area corresponding to the fourth intermediate layer.

6. The display panel of claim 5, further comprising a third barrier wall on the pixel-defining layer between the second pixel and the fourth pixel.

7. The display panel of claim 6, wherein the second opposite electrode is on a top surface of the third barrier wall.

8. The display panel of claim 1, wherein a distal end of the first opposite electrode and a distal end of the second opposite electrode that overlap each other on the first barrier wall, are on the first barrier wall.

9. The display panel of claim 1, wherein the first opposite electrode and the second opposite electrode have an overlapping area in which at least a part of the first opposite electrode and at least a part of the second opposite electrode overlap each other, and the overlapping area has a first reflectivity, and the first pixel area and the second pixel area other than the overlapping area have a second reflectivity that is different from the first reflectivity.

10. The display panel of claim 1, wherein the first opposite electrode is in at least one first pixel area.

11. The display panel of claim 1, wherein the second opposite electrode is in at least one second pixel area.

12. The display panel of claim 1, wherein
a top surface of the first opposite electrode and a bottom surface of the second opposite electrode are in surface contact with each other on the first barrier wall and are in electric contact with each other.

13. The display panel of claim 1, wherein
the first pixel area, the second pixel area, and the transmission area cross one another and are in a grid arrangement.

14. The display panel of claim 1, wherein
the first opposite electrode has a shape of a first rectangle with a first width in a first direction, and
the second opposite electrode has a shape of a second rectangle with a second width in the first direction, and
a size of the first width is the same as that of the second width.

15. The display panel of claim 1, wherein
a plurality of first pixel areas, a plurality of second pixel areas, and a plurality of transmission areas are provided in the auxiliary display area, and
the plurality of first pixel areas and the plurality of second pixel areas are in a third direction, and the plurality of transmission areas are in the third direction.

16. A display device comprising:
a display panel comprising a substrate comprising a main display area and an auxiliary display area comprising a pixel area and a transmission area, the pixel area comprising a first pixel area and a second pixel area,
a first pixel in the first pixel area and comprising a first pixel electrode, a first opposite electrode, and a first intermediate layer between the first pixel electrode and the first opposite electrode,
a second pixel in the second pixel area and comprising a second pixel electrode, a second opposite electrode, and a second intermediate layer between the second pixel electrode and the second opposite electrode,
a pixel-defining layer, which is on the first pixel electrode and the second pixel electrode and through which centers of the first pixel electrode and the second pixel electrode are respectively exposed, and
a first barrier wall on the pixel-defining layer between the first pixel and the second pixel and having a top surface on which the first opposite electrode and the second opposite electrode overlap each other; and
a component under the substrate at the auxiliary display area and comprising an electronic element configured to emit or receive a signal.

17. The display device of claim 16, wherein
resolution of an image provided from the auxiliary display area is lower than resolution of an image provided from the main display area.

18. The display device of claim 16, wherein
the first opposite electrode and the second opposite electrode have an overlapping area in which at least a part of the first opposite electrode and at least a part of the second opposite electrode overlap each other, and
the overlapping area has a first reflectivity, and
the first pixel area and the second pixel area other than the overlapping area have a second reflectivity that is different from the first reflectivity.

19. The display device of claim 16, wherein
a top surface of the first opposite electrode and a bottom surface of the second opposite electrode are in surface contact with each other on the first barrier wall and are in electric contact with each other.

20. The display device of claim 16, wherein
the first pixel area, the second pixel area, and the transmission area cross one another and are in a grid arrangement.

\* \* \* \* \*